(12) United States Patent
Yang et al.

(10) Patent No.: US 9,837,146 B2
(45) Date of Patent: Dec. 5, 2017

(54) MEMORY SYSTEM TEMPERATURE MANAGEMENT

(71) Applicant: SanDisk Technologies LLC, Plano, TX (US)

(72) Inventors: Nian Niles Yang, Mountain View, CA (US); Chris Nga Yee Yip, Saratoga, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 15/195,927

(22) Filed: Jun. 28, 2016

(65) Prior Publication Data

US 2017/0200492 A1    Jul. 13, 2017

Related U.S. Application Data

(60) Provisional application No. 62/276,771, filed on Jan. 8, 2016.

(51) Int. Cl.
*G11C 11/56*    (2006.01)

(52) U.S. Cl.
CPC ...... *G11C 11/5642* (2013.01); *G11C 11/5628* (2013.01)

(58) Field of Classification Search
CPC .................. G11C 11/5642; G11C 11/5628
USPC ................................................. 365/185.17
See application file for complete search history.

(56) References Cited

U.S. PATENT DOCUMENTS

| 4,586,167 A | 4/1986 | Fujishima et al. |
| 5,559,988 A | 9/1996 | Durante et al. |

(Continued)

FOREIGN PATENT DOCUMENTS

| EP | 0 376 285 A2 | 7/1990 |
| WO | WO 2012/083308 | 6/2012 |

OTHER PUBLICATIONS

Atmel Data-sheet ("9- to 12-bit Selectable, ±0.5° C. Accurate Digital Temperature Sensor with Nonvolatile Registers and Serial EEPROM", www.atmel.com/images/Atmel-8854-DTS-AT30TSE752A-754A-758A-Datasheet.pdf, Atmel Data-sheet , Mar. 1, 2011—Atmel-8854G-DTS-AT30TSE752A-754A-758A-Datasheet_102014, 2011).*

(Continued)

*Primary Examiner* — Anthan Tran
*Assistant Examiner* — Mushfique Siddique
(74) *Attorney, Agent, or Firm* — Brinks Gilson & Lione

(57) ABSTRACT

Systems, methods and/or devices are used to adjust a read property for a memory portion of non-volatile memory. In one aspect, in response to receiving a program request, the device: detects a first temperature of the memory portion; and stores first temperature data corresponding to the detected first temperature. In response to receiving a read request, the device performs an adjustment determination, including: detecting a second temperature of the memory portion of the non-volatile memory, retrieving the stored first temperature data, and determining, in accordance with the detected second temperature and the retrieved first temperature data, whether to perform the read using an adjusted read property. In accordance with a determination to perform the read using the adjusted read property, the device performs a read on the memory portion using the adjusted read property.

16 Claims, 10 Drawing Sheets

(56) References Cited

U.S. PATENT DOCUMENTS

| | | | |
|---|---|---|---|
| 5,909,559 A | 6/1999 | So | |
| 6,247,136 B1 | 6/2001 | MacWilliams et al. | |
| 6,292,410 B1 | 9/2001 | Yi et al. | |
| 6,401,213 B1 | 6/2002 | Jeddeloh | |
| 6,449,709 B1 | 9/2002 | Gates | |
| 7,272,063 B1* | 9/2007 | Egerer | G11C 7/04 365/211 |
| 7,969,809 B2 | 6/2011 | Ben-Rubi | |
| 8,010,738 B1 | 8/2011 | Chilton et al. | |
| 8,122,202 B2 | 2/2012 | Gillingham | |
| 8,213,255 B2* | 7/2012 | Hemink | G11C 7/04 365/185.18 |
| 8,255,618 B1 | 8/2012 | Borchers et al. | |
| 8,321,627 B1 | 11/2012 | Norrie et al. | |
| 8,429,498 B1 | 4/2013 | Anholt et al. | |
| 8,479,080 B1 | 7/2013 | Shalvi et al. | |
| 8,539,139 B1 | 9/2013 | Morris | |
| 8,595,590 B1 | 11/2013 | Vojcic et al. | |
| 8,775,720 B1 | 7/2014 | Meyer et al. | |
| 8,825,967 B2 | 9/2014 | Hong Beom | |
| 8,874,836 B1 | 10/2014 | Hayes et al. | |
| 8,886,872 B1 | 11/2014 | Norrie | |
| 8,924,661 B1 | 12/2014 | Shachar et al. | |
| 8,984,376 B1 | 3/2015 | Norrie | |
| 9,128,825 B1 | 9/2015 | Albrecht et al. | |
| 9,170,876 B1 | 10/2015 | Bates et al. | |
| 9,176,864 B2* | 11/2015 | Gorobets | G06F 12/0246 |
| 9,176,971 B2 | 11/2015 | Shapiro | |
| 9,214,965 B2 | 12/2015 | Fitzpatrick et al. | |
| 9,244,763 B1* | 1/2016 | Kankani | G06F 11/1008 |
| 9,454,420 B1* | 9/2016 | Tai | G06F 11/073 |
| 9,484,098 B1* | 11/2016 | Hsu | G11C 11/5642 |
| 9,645,749 B2* | 5/2017 | Truong | G06F 3/0616 |
| 9,666,249 B1* | 5/2017 | Park | G11C 7/10 |
| 9,715,939 B2* | 7/2017 | Ellis | G11C 16/3459 |
| 2003/0115403 A1 | 6/2003 | Bouchard et al. | |
| 2003/0122834 A1 | 7/2003 | Mastronarde et al. | |
| 2004/0117441 A1 | 6/2004 | Liu et al. | |
| 2005/0144361 A1 | 6/2005 | Gonzalez et al. | |
| 2005/0248992 A1 | 11/2005 | Hwang et al. | |
| 2006/0285408 A1* | 12/2006 | Betser | G11C 16/3404 365/212 |
| 2007/0002629 A1 | 1/2007 | Lee et al. | |
| 2007/0156998 A1 | 7/2007 | Gorobets | |
| 2007/0233937 A1 | 10/2007 | Coulson et al. | |
| 2008/0140914 A1 | 6/2008 | Jeon | |
| 2008/0147994 A1 | 6/2008 | Jeong et al. | |
| 2008/0235466 A1 | 9/2008 | Traister | |
| 2008/0235480 A1 | 9/2008 | Traister | |
| 2008/0295094 A1 | 11/2008 | Korupolu et al. | |
| 2009/0091979 A1* | 4/2009 | Shalvi | G11C 11/56 365/185.09 |
| 2009/0168525 A1 | 7/2009 | Olbrich et al. | |
| 2009/0177943 A1 | 7/2009 | Silvus et al. | |
| 2009/0222627 A1 | 9/2009 | Reid | |
| 2009/0282191 A1 | 11/2009 | Depta | |
| 2010/0005217 A1 | 1/2010 | Jeddeloh | |
| 2010/0014364 A1 | 1/2010 | Laberge et al. | |
| 2010/0082879 A1 | 4/2010 | McKean et al. | |
| 2010/0165730 A1 | 7/2010 | Sommer et al. | |
| 2010/0174845 A1 | 7/2010 | Gorobets et al. | |
| 2010/0174853 A1 | 7/2010 | Lee et al. | |
| 2010/0220509 A1 | 9/2010 | Solokov et al. | |
| 2010/0250874 A1 | 9/2010 | Farrell et al. | |
| 2011/0113204 A1 | 5/2011 | Henriksson et al. | |
| 2011/0138100 A1 | 6/2011 | Sinclair | |
| 2011/0235434 A1 | 9/2011 | Byom et al. | |
| 2011/0252215 A1 | 10/2011 | Franceschini et al. | |
| 2011/0264851 A1 | 10/2011 | Jeon et al. | |
| 2011/0302474 A1 | 12/2011 | Goss et al. | |
| 2012/0030408 A1 | 2/2012 | Flynn et al. | |
| 2012/0047317 A1 | 2/2012 | Yoon et al. | |
| 2012/0159070 A1 | 6/2012 | Baderdinni et al. | |
| 2012/0198129 A1 | 8/2012 | Van Aken et al. | |
| 2012/0224425 A1* | 9/2012 | Fai | G11C 11/5642 365/185.09 |
| 2012/0239976 A1* | 9/2012 | Cometti | G11C 16/10 714/24 |
| 2012/0278530 A1 | 11/2012 | Ebsen | |
| 2012/0324180 A1 | 12/2012 | Asnaashari et al. | |
| 2013/0007380 A1 | 1/2013 | Seekins et al. | |
| 2013/0070507 A1 | 3/2013 | Yoon | |
| 2013/0111112 A1 | 5/2013 | Jeong et al. | |
| 2013/0111289 A1 | 5/2013 | Zhang et al. | |
| 2013/0111290 A1 | 5/2013 | Zhang et al. | |
| 2013/0132650 A1 | 5/2013 | Choi et al. | |
| 2013/0182506 A1 | 7/2013 | Melik-Martirosian | |
| 2013/0194872 A1* | 8/2013 | Sim | G11C 16/26 365/185.17 |
| 2013/0219106 A1 | 8/2013 | Vogan et al. | |
| 2013/0232290 A1 | 9/2013 | Ish et al. | |
| 2013/0254498 A1 | 9/2013 | Adachi et al. | |
| 2013/0262745 A1 | 10/2013 | Lin et al. | |
| 2013/0297894 A1 | 11/2013 | Cohen et al. | |
| 2013/0346805 A1 | 12/2013 | Sprouse et al. | |
| 2014/0006688 A1 | 1/2014 | Yu et al. | |
| 2014/0013026 A1 | 1/2014 | Venkata et al. | |
| 2014/0047170 A1 | 2/2014 | Cohen et al. | |
| 2014/0075100 A1 | 3/2014 | Kaneko et al. | |
| 2014/0143637 A1 | 5/2014 | Cohen et al. | |
| 2014/0173239 A1 | 6/2014 | Schushan | |
| 2014/0229655 A1 | 8/2014 | Goss et al. | |
| 2014/0229656 A1 | 8/2014 | Goss et al. | |
| 2014/0241071 A1 | 8/2014 | Goss et al. | |
| 2014/0244897 A1 | 8/2014 | Goss et al. | |
| 2014/0244899 A1 | 8/2014 | Schmier et al. | |
| 2014/0258598 A1 | 9/2014 | Canepa et al. | |
| 2014/0281833 A1 | 9/2014 | Kroeger et al. | |
| 2014/0310241 A1 | 10/2014 | Goyen | |
| 2014/0379988 A1 | 12/2014 | Lyakhovitskiy et al. | |
| 2015/0052414 A1* | 2/2015 | Igari | G06F 11/1008 714/764 |
| 2015/0067172 A1 | 3/2015 | Ashokan et al. | |
| 2015/0074487 A1* | 3/2015 | Patapoutian | G06F 11/1012 714/758 |
| 2015/0095558 A1 | 4/2015 | Kim et al. | |
| 2015/0113206 A1 | 4/2015 | Fitzpatrick et al. | |
| 2015/0186278 A1 | 7/2015 | Jayakumar et al. | |
| 2015/0234612 A1 | 8/2015 | Himelstein et al. | |
| 2015/0261473 A1 | 9/2015 | Matsuyama et al. | |
| 2015/0262632 A1 | 9/2015 | Shelton et al. | |
| 2015/0301749 A1 | 10/2015 | Seo et al. | |
| 2015/0310938 A1* | 10/2015 | Kim | G11C 29/50004 714/721 |
| 2015/0331627 A1 | 11/2015 | Kwak | |
| 2015/0332780 A1* | 11/2015 | Jang | G11C 7/04 365/185.18 |
| 2016/0026386 A1 | 1/2016 | Ellis et al. | |
| 2016/0034194 A1 | 2/2016 | Brokhman et al. | |
| 2016/0062699 A1* | 3/2016 | Samuels | G06F 3/0649 711/103 |
| 2016/0070493 A1 | 3/2016 | Oh et al. | |
| 2016/0071612 A1* | 3/2016 | Takizawa | G11C 16/3495 365/185.11 |
| 2016/0117099 A1 | 4/2016 | Prins et al. | |
| 2016/0117102 A1 | 4/2016 | Hong et al. | |
| 2016/0117105 A1* | 4/2016 | Thangaraj | G06F 3/0616 711/103 |
| 2016/0117216 A1* | 4/2016 | Muchherla | G06F 11/08 714/6.11 |
| 2016/0117252 A1 | 4/2016 | Thangaraj et al. | |
| 2016/0170671 A1 | 6/2016 | Huang | |
| 2016/0170831 A1 | 6/2016 | Lesatre et al. | |
| 2016/0179403 A1 | 6/2016 | Kurotsuchi et al. | |
| 2016/0210060 A1 | 7/2016 | Dreyer | |
| 2016/0299689 A1 | 10/2016 | Kim et al. | |
| 2016/0299699 A1 | 10/2016 | Vanaraj et al. | |
| 2016/0299704 A1 | 10/2016 | Vanaraj et al. | |
| 2016/0299724 A1 | 10/2016 | Vanaraj et al. | |
| 2016/0342344 A1 | 11/2016 | Kankani et al. | |

(56) References Cited

U.S. PATENT DOCUMENTS

2016/0342345 A1 11/2016 Kankani et al.
2016/0371394 A1 12/2016 Shahidi et al.

OTHER PUBLICATIONS

Atmel Data-sheet, "9-to-bit Selectable, ±0.5° C. Accurate Digital Temperature Sensor with Nonvolatile Registers and Serial EEPROM" www.atmel.com/images/Atmel-8854-DTS-AT30TSE752A-754A-758A-Datasheet.pdf, Atmel Data-sheet, Mar. 1, 2011,—Atmel-8854-DTS-AT30TSE752A-754A-758A-Datasheet_102014, 57 pages.
Seagate Technology, "SCSI Commands Reference Manual, Rev. C", Product Manual dated Apr. 2010, pp. 211-214.
Tanenbaum, "Structured Computer Organization", 3rd edition 1990, section 1.4, p. 11, 3 pages.
International Search Report and Written Opinion dated Nov. 18, 2015, received in International Patent Application No. PCT/US2015/039552 which corresponds to U.S. Appl. No. 14/559,183, 11 pages (Ellis).
International Search Report and Written Opinion dated Jul. 4, 2016, received in International Patent Application No. PCT/US2016/028477, which corresponds to U.S. Appl. No. 14/883,540, 11 pages (Hodgdon).
International Search Report and Written Opinion dated Nov. 9, 2015, received in International Patent Application No. PCT/US2015/053551, which corresponds to U.S. Appl. No. 14/668,690, 12 pages (Thangaraj).
International Search Report and Written Opinion dated Nov. 11, 2015, received in International Patent Application No. PCT/US2015/053582, which corresponds to U.S. Appl. No. 14/659,493, 12 pages (Prins).
International Search Report and Written Opinion dated Sep. 8, 2016, received in International Patent Application No. PCT/US2016/036716, which corresponds to U.S. Appl. No. 14/925.945, 13 pages (Ellis).

* cited by examiner

Temperature Data Storage Table 500

| Temperature Range Value | Temperature Range (°C) | Number of Cells Having Erased State | Temperature Data Cell State (pgm = "programmed") |||||||| 
| --- | --- | --- | --- | --- | --- | --- | --- | --- | --- | --- |
| | | | Cell 0 | Cell 1 | Cell 2 | Cell 3 | Cell 4 | Cell 5 | Cell 6 | Cell 7 |
| 0 | -10 to 0 | 8 | erased | erased | erased | erased | erased | erased | erased | erased |
| 1 | 1 to 10 | 7 | pgm | erased | erased | erased | erased | erased | erased | erased |
| 2 | 11 to 20 | 6 | pgm | pgm | erased | erased | erased | erased | erased | erased |
| 3 | 21 to 30 | 5 | pgm | pgm | pgm | erased | erased | erased | erased | erased |
| 4 | 31 to 40 | 4 | pgm | pgm | pgm | pgm | erased | erased | erased | erased |
| 5 | 41 to 50 | 3 | pgm | pgm | pgm | pgm | pgm | erased | erased | erased |
| 6 | 51 to 60 | 2 | pgm | pgm | pgm | pgm | pgm | pgm | erased | erased |
| 7 | 61 to 70 | 1 | pgm | pgm | pgm | pgm | pgm | pgm | pgm | erased |
| 8 | 71 to 80 | 0 | pgm | pgm | pgm | pgm | pgm | pgm | pgm | pgm |

Figure 5

MEMORY SYSTEM TEMPERATURE MANAGEMENT

RELATED APPLICATIONS

This application claims priority to U.S. Provisional Patent Application No. 62/276,771, filed Jan. 8, 2016, which is hereby incorporated by reference in its entirety.

TECHNICAL FIELD

The disclosed embodiments relate generally to memory systems, and in particular, to using temperature data for adjusting a read property for performing a read on a memory portion of a storage device.

BACKGROUND

Semiconductor memory devices, including flash memory, typically utilize memory cells to store data as an electrical value, such as an electrical charge or voltage. Each flash memory cell typically includes a single transistor with a floating gate that is used to store a charge, which modifies the threshold voltage of the transistor (i.e., the voltage needed to turn the transistor on). The magnitude of the charge, and the corresponding threshold voltage, is used to represent one or more data values. During a read operation, a reading threshold voltage is applied to the control gate of the transistor and the resulting sensed current or voltage is mapped to a data value. A multi-level cell (MLC) flash memory device is used to store multiple bits by using voltage ranges within the total voltage range of the memory cell to represent different bit-tuples.

Errors in the cell voltage sensed when reading the memory cell can occur due to "drift" of the cell voltage between the time data is written to the memory cell and the time a read operation is performed to read the data stored in the memory cell. Temperature fluctuations that occur between a write to a memory cell and a subsequent read of the memory cell are a potential cause or contributory cause of cell voltage drift.

SUMMARY

Without limiting the scope of the appended claims, after considering this disclosure, and particularly after considering the section entitled "Detailed Description" one will understand how the aspects of various embodiments are used to adjust a read property for memory portion of non-volatile memory in a storage device. In particular, in response to receiving a program request, a first temperature of a memory portion is detected and data corresponding to the detected first temperature is stored as first temperature data. After storing the first temperature data, a read request is received. In response to receiving the read request, an adjustment determination is performed. The adjustment determination includes: detecting a second temperature of the memory portion of the non-volatile memory, retrieving the stored first temperature data, and determining, in accordance with the detected second temperature and the retrieved first temperature data, whether to perform the read using an adjusted read property. Determining whether to perform the read using the adjusted read property includes comparing a second temperature value corresponding to the detected second temperature with a first temperature value corresponding to the retrieved first temperature data. In accordance with a determination to perform the read using the adjusted read property, a read is performed on the memory portion using the adjusted read property. In accordance with a determination not to perform the read using the adjusted read property, a read is performed on the memory portion using a default read property.

BRIEF DESCRIPTION OF THE DRAWINGS

So that the present disclosure can be understood in greater detail, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 5 is a prophetic diagram illustrating a temperature data storage table indicating a series of bits that correspond to temperature ranges, in accordance with some embodiments.

Figure 1:
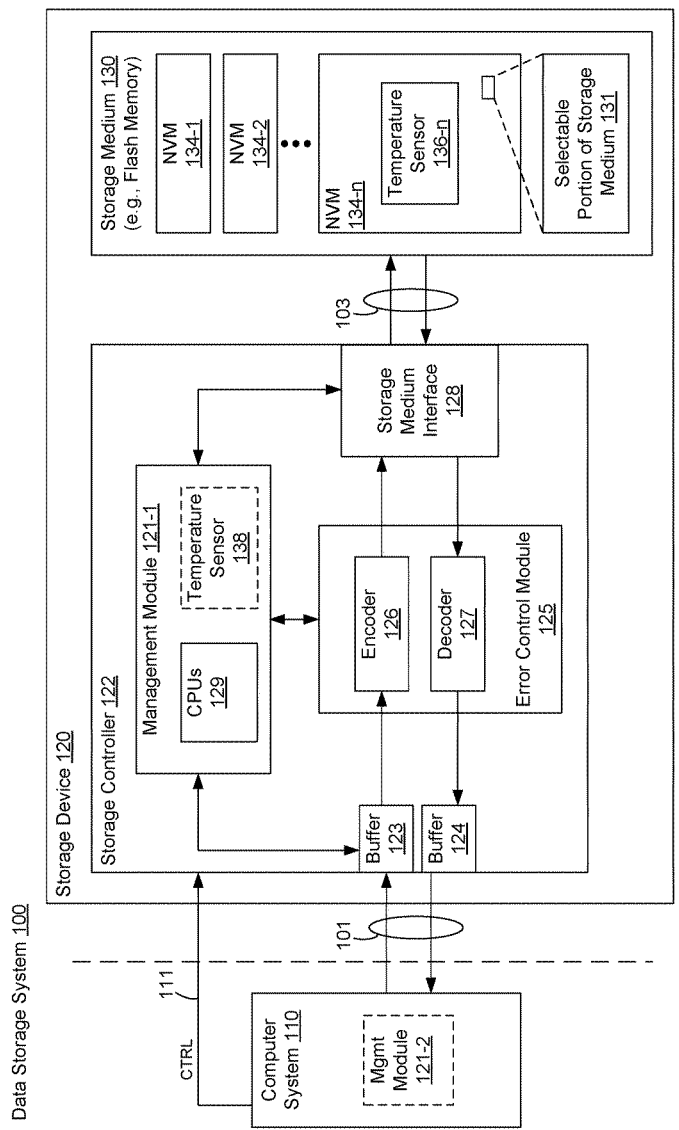
FIG. 1 is a block diagram illustrating an implementation of a data storage system, in accordance with some embodiments.

In accordance with common practice the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

The various embodiments described herein include systems, methods and/or devices used to determine an adjustment for a read property for a memory portion of non-volatile memory in a storage device.

(A1) More specifically, some embodiments include a method for adjusting a read property for a memory portion of non-volatile memory in a storage device, the method comprising: receiving a program request; in response to receiving the program request: detecting a first temperature of the memory portion of the non-volatile memory, and storing first temperature data corresponding to the detected first temperature; after storing the first temperature data, receiving a read request; in response to receiving the read request, performing an adjustment determination, wherein the adjustment determination includes: detecting a second temperature of the memory portion of the non-volatile memory, retrieving the stored first temperature data, and determining, in accordance with the detected second temperature and the retrieved first temperature data, whether to perform the read using an adjusted read property, wherein determining whether to perform the read using the adjusted read property includes comparing a second temperature value corresponding to the detected second temperature with a first temperature value corresponding to the retrieved first temperature data; in accordance with a determination to perform the read using the adjusted read property, performing a read on the memory portion using the adjusted read property; and in accordance with a determination not to perform the read using the adjusted read property, performing a read on the memory portion using a default read property.

(A2) In some embodiments of the method of A1, storing the first temperature data includes: appending the first temperature data to a data payload of the program request, and storing, to the memory portion of the non-volatile memory, the data payload with the appended first temperature data.

(A3) In some embodiments of the method of A1-A2, the first temperature data is stored in a data structure that is stored in the storage device.

(A4) In some embodiments of the method of any of A1-A3, the stored first temperature data includes a series of bits, each stored in an individual memory cell, wherein a temperature range is indicated by a number of bits having an erase state within the series of bits.

(A5) In some embodiments of the method of A4, the storage device includes a plurality of memory cells; the plurality of memory cells each store one of N distinct data values as a cell voltage, wherein the N distinct data values correspond to N sequential voltage ranges; and each bit in the series of bits is stored in a memory cell having a programmed state indicated by a cell voltage within either a lowest range of the N sequential voltage ranges or a predefined range that is a fourth or higher range of the N sequential voltage ranges, and wherein N is an integer greater than or equal to four.

(A6) In some embodiments of the method of any of A1-A5, determining whether to perform the read using an adjusted read property includes determining, for a word line corresponding to the memory portion, a ratio of a number of programmed memory cells of the word line to a total number of memory cells of the word line; and; in accordance with a determination that the determined ratio does not meet predefined ratio criteria, determining to perform the read using the adjusted read property.

(A7) In some embodiments of the method of any of A1-A6, the first temperature is detected using a temperature sensor of a non-volatile memory device that includes the memory portion.

(A8) In some embodiments of the method of any of A1-A7, the storage device includes a respective non-volatile memory device that includes the memory portion, and the first temperature is detected using a temperature sensor of a controller device that is different from the respective non-volatile memory device that includes the memory portion.

(A9) In some embodiments of the method of any of A1-A8, in accordance with a determination to perform the read using the adjusted read property, performing a subsequent write to a non-volatile memory device of the storage device using an adjusted write property.

(A10) In some embodiments of the method of any of A1-A9, the storage device comprises one or more three-dimensional (3D) memory devices and circuitry associated with operation of memory elements in the one or more 3D memory devices.

(A11) In some embodiments of the method of A10, the circuitry and one or more memory elements in a respective 3D memory device, of the one or more 3D memory devices, are on the same substrate.

(A12) In another aspect, a storage device includes (1) non-volatile memory, (2) one or more processors, and (3) controller memory (e.g., a non-transitory computer readable storage medium in the storage device) storing one or more programs, which when executed by the one or more processors cause the storage device to perform or control performance of any of the methods A1-A11 described herein.

(A12) In yet another aspect, any of the methods A1-A11 described above are performed by a storage device including means for performing any of the methods described herein.

(A13) In yet another aspect, some embodiments include a non-transitory computer readable storage medium, storing one or more programs configured for execution by one or more processors of a storage device, the one or more programs including instructions for performing any of the methods A1-A11 described herein.

Numerous details are described herein in order to provide a thorough understanding of the example embodiments illustrated in the accompanying drawings. However, some embodiments may be practiced without many of the specific details, and the scope of the claims is only limited by those features and aspects specifically recited in the claims. Furthermore, well-known methods, components, and circuits have not been described in exhaustive detail so as not to unnecessarily obscure pertinent aspects of the embodiments described herein.

FIG. 1 is a block diagram illustrating an implementation of a data storage system 100, in accordance with some embodiments. While some example features are illustrated, various other features have not been illustrated for the sake of brevity and so as not to obscure pertinent aspects of the example embodiments disclosed herein. To that end, as a non-limiting example, data storage system 100 includes a storage device 120 (also sometimes called an information storage device, or a data storage device, or a memory device), which includes a storage controller 122 and a storage medium 130, and is used in conjunction with or includes a computer system 110 (e.g., a host system or a host computer).

In some embodiments, storage medium 130 is a single flash memory device while in other embodiments storage medium 130 includes a plurality of flash memory devices. In some embodiments, storage medium 130 is NAND-type flash memory or NOR-type flash memory. In some embodiments, storage medium 130 includes one or more three-dimensional (3D) memory devices.

Further, in some embodiments, storage controller 122 is a solid-state drive (SSD) controller. However, other types of storage media may be included in accordance with aspects of a wide variety of embodiments (e.g., PCRAM, ReRAM, STT-RAM, etc.). In some embodiments, a flash memory device includes one or more flash memory die, one or more flash memory packages, one or more flash memory channels, or the like. In some embodiments, data storage system 100 includes one or more storage devices 120.

Computer system 110 is coupled to storage controller 122 through data connections 101, and optionally through a control bus or connection 111 as well. However, in some embodiments computer system 110 includes storage controller 122, or a portion of storage controller 122, as a component and/or as a subsystem. For example, in some embodiments, some or all of the functionality of storage controller 122 is implemented by software executed on computer system 110. Computer system 110 may be any suitable computer device, such as a computer, a laptop computer, a tablet device, a netbook, an internet kiosk, a personal digital assistant, a mobile phone, a smart phone, a gaming device, a computer server, or any other computing device. Computer system 110 is sometimes called a host, host system, client, or client system. In some embodiments, computer system 110 is a server system, such as a server system in a data center. In some embodiments, computer system 110 includes one or more processors, one or more types of memory, a display, and/or other user interface components such as a keyboard, a touch screen display, a mouse, a track-pad, a digital camera and/or any number of supplemental I/O devices to add functionality to computer system 110. In some embodiments, computer system 110 does not have a display and other user interface components.

Storage medium 130 is coupled to storage controller 122 through connections 103. Connections 103 are sometimes called data connections, but typically convey commands in addition to data, and optionally convey metadata, error correction information, and/or other information in addition to data values to be stored in storage medium 130 and data values read from storage medium 130. In some embodiments, however, storage controller 122 and storage medium 130 are included in the same device (i.e., an integrated device) as components thereof. Furthermore, in some embodiments storage controller 122 and storage medium 130 are embedded in a host device (e.g., computer system 110), such as a mobile device, tablet, other computer or computer controlled device, and the methods described herein are performed, at least in part, by the embedded storage controller. Storage medium 130 may include any number (i.e., one or more) of memory devices (e.g., NVM 134-1, NVM 134-2, through NVM 134-*n*) including, without limitation, persistent memory or non-volatile semiconductor memory devices, such as flash memory device(s). For example, flash memory device(s) can be configured for enterprise storage suitable for applications such as cloud computing, for database applications, primary and/or secondary storage, or for caching data stored (or to be stored) in secondary storage, such as hard disk drives. Additionally and/or alternatively, flash memory device(s) can also be configured for relatively smaller-scale applications such as personal flash drives or hard-disk replacements for personal, laptop and tablet computers.

Memory devices (e.g., NVM 134-1, NVM 134-2, etc.) of storage medium 130 include addressable and individually selectable blocks, such as selectable portion of storage medium 131 (also referred to herein as selected portion 131). In some embodiments, the individually selectable blocks (sometimes called erase blocks) are the minimum size erasable units in a flash memory device. In other words, each block contains the minimum number of memory cells that can be erased simultaneously. Each block is usually further divided into a plurality of pages and/or word lines, where each page or word line is typically an instance of the smallest individually accessible (readable) portion in a block. In some embodiments (e.g., using some types of flash memory), the smallest individually accessible unit of a data set is a sector, which is a subunit of a page. That is, a block includes a plurality of pages, each page contains a plurality of sectors, and each sector is the minimum unit of data for writing data to or reading data from the flash memory device.

In some embodiments, one block comprises any number of pages, for example, 64 pages, 128 pages, 256 pages, or another suitable number of pages. Blocks are typically grouped into a plurality of zones. Each block zone can be independently managed to some extent, which increases the degree of parallelism for parallel operations and simplifies management of storage medium 130.

In some embodiments, one or more of NVM 134-1, NVM 134-2 . . . NVM 134-*n* includes a temperature sensor 136 (e.g., temperature sensor 136-*n*). Temperature sensor 136 outputs an indication of an operating temperature for storage medium 130, for example, when a read, write, or other data operation is performed on selectable portion of storage medium 131. Alternatively (or additionally), in some embodiments, management module 121-1 includes temperature sensor 138 that outputs an indication of an operating temperature for storage device 120, for example, when a read, write, or other data operation is performed on selectable portion of storage medium 131. Temperature sensor 136, 138 is, for example, a thermistor or a silicon bandgap temperature sensor.

Stored data may be stored and/or read erroneously due to electrical fluctuations, defects in the storage medium, operating conditions (such as temperature fluctuations), device history, write-read circuitry, etc., or a combination of these and/or various other factors. As described in greater detail below, error control coding can be utilized to limit the number of uncorrectable errors that are introduced.

In some embodiments, storage controller 122 includes a management module 121-1, an input buffer 123, an output buffer 124, an error control module 125 and a storage medium I/O interface 128. Storage controller 122 may include various additional features that have not been illustrated for the sake of brevity and so as not to obscure pertinent features of the example embodiments disclosed herein, and that a different arrangement of features may be possible. Input and output buffers 123, 124, sometimes collectively called a host interface, provide an interface to computer system 110 through data connections 101. Similarly, storage medium I/O interface 128 provides an interface to storage medium 130 though connections 103. In some embodiments, storage medium I/O interface 128 includes read and write circuitry, including circuitry capable of providing reading signals to storage medium 130 (e.g., reading threshold voltages for NAND-type flash memory).

In some embodiments, management module 121-1 includes one or more processing units 129 (sometimes herein called CPUs, processors, or hardware processors, and sometimes implemented using microprocessors, microcontrollers, or the like) configured to execute instructions in one or more programs (e.g., in management module 121-1). In some embodiments, the one or more CPUs 129 are shared by one or more components within, and in some cases, beyond the function of storage controller 122. In some embodiments, management module 121-1 includes temperature sensor 138. For example, temperature sensor 138 is a component of a CPU 129 or is a separate component from the one or more CPUs 129. Management module 121-1 is coupled to input buffer 123, output buffer 124 (connection not shown), error control module 125 and storage medium I/O interface 128 to coordinate the operation of these components. In some embodiments, one or more modules of management module 121-1 are implemented in management module 121-2 of computer system 110. In some embodiments, one or more processors of computer system 110 (not shown) are configured to execute instructions in one or more programs (e.g., in management module 121-2). Management module 121-2 is coupled to storage device 120 in order to manage the operation of storage device 120.

Error control module 125 is coupled to storage medium I/O interface 128, input buffer 123, output buffer 124, and management module 121-1. Error control module 125 is provided to limit the number of uncorrectable errors inadvertently introduced into data (e.g., during writes to memory or reads from memory). In some embodiments, error control module 125 is executed in software by the one or more CPUs 129 of management module 121-1, and, in other embodiments, error control module 125 is implemented in whole or in part using special purpose circuitry to perform data encoding and decoding functions. To that end, in some embodiments, error control module 125 includes an encoder 126 and a decoder 127. Encoder 126 encodes data by applying an error control code to produce a codeword, which is subsequently stored in storage medium 130.

When the encoded data (e.g., one or more codewords) is read from storage medium 130, decoder 127 applies a decoding process to the encoded data to recover the data, and to correct errors in the recovered data within the error correcting capability of the error control code. Those skilled in the art will appreciate that various error control codes have different error detection and correction capacities, and that particular codes are selected for various applications for reasons beyond the scope of this disclosure. As such, an exhaustive review of the various types of error control codes is not provided herein. Moreover, those skilled in the art will appreciate that each type or family of error control codes may have encoding and decoding algorithms that are particular to the type or family of error control codes. On the other hand, some algorithms may be utilized at least to some extent in the decoding of a number of different types or families of error control codes. As such, for the sake of brevity, an exhaustive description of the various types of encoding and decoding algorithms generally available and known to those skilled in the art is not provided herein.

During a write operation, input buffer 123 receives data to be stored in storage medium 130 from computer system 110. The data held in input buffer 123 is made available to encoder 126, which encodes the data to produce one or more codewords. The one or more codewords are made available to storage medium I/O interface 128, which transfers the one or more codewords to storage medium 130 in a manner dependent on the type of storage medium being utilized.

A read operation is initiated when computer system (host) 110 sends one or more host read commands (e.g., via control line 111 or data connections 101) to storage controller 122 requesting data from storage medium 130. Storage controller 122 sends one or more read access commands to storage medium 130, via storage medium I/O interface 128, to obtain raw read data in accordance with memory locations (addresses) specified by the one or more host read commands. Storage medium I/O interface 128 provides the raw read data (e.g., comprising one or more codewords) to decoder 127. If the decoding is successful, the decoded data is provided to output buffer 124, where the decoded data is made available to computer system 110. In some embodiments, if the decoding is not successful, storage controller 122 may resort to a number of remedial actions or provide an indication of an irresolvable error condition.

The terms "cell voltage" and "memory cell voltage," in the context of flash memory cells, typically mean the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to flash memory cells are gate voltages applied to the gates of the flash memory cells to determine whether the memory cells conduct current at that gate voltage. When a flash memory cell is a single level cell, the memory cell's transistor conducts current at a given reading threshold voltage, indicating that the cell voltage is less than the reading threshold voltage, the raw data value for that read operation is a "1" and otherwise the raw data value is a "0." In some embodiments, a multi-level cell (MLC) NAND flash typically has four possible states per cell, yielding two bits of information per cell. Further, in some embodiments, a MLC NAND has two page types: (1) a lower page (sometimes called fast page), and (2) an upper page (sometimes called slow page). In some embodiments, a triple-level cell (TLC) NAND flash has eight possible states per cell, yielding three bits of information per cell. Although the description herein uses TLC, MLC, and SLC as examples, those skilled in the art will appreciate that the embodiments described herein may be extended to memory cells that have more than eight possible states per cell, yielding more than three bits of information per cell.

The encoding format of the storage media (i.e., TLC, MLC, or SLC and/or a chosen data redundancy mechanism) is a choice made when data is actually written to the storage media. In this specification there are described events, conditions, or processes that are said to set the encoding format, alter the encoding format of the storage media, etc. It should be recognized that the actual process may involve multiple steps, e.g., erasure of the previous contents of the storage media followed by the data being written using the new encoding format and that these operations may be separated in time from the initiating event, condition, or procedure.

Figure 2:
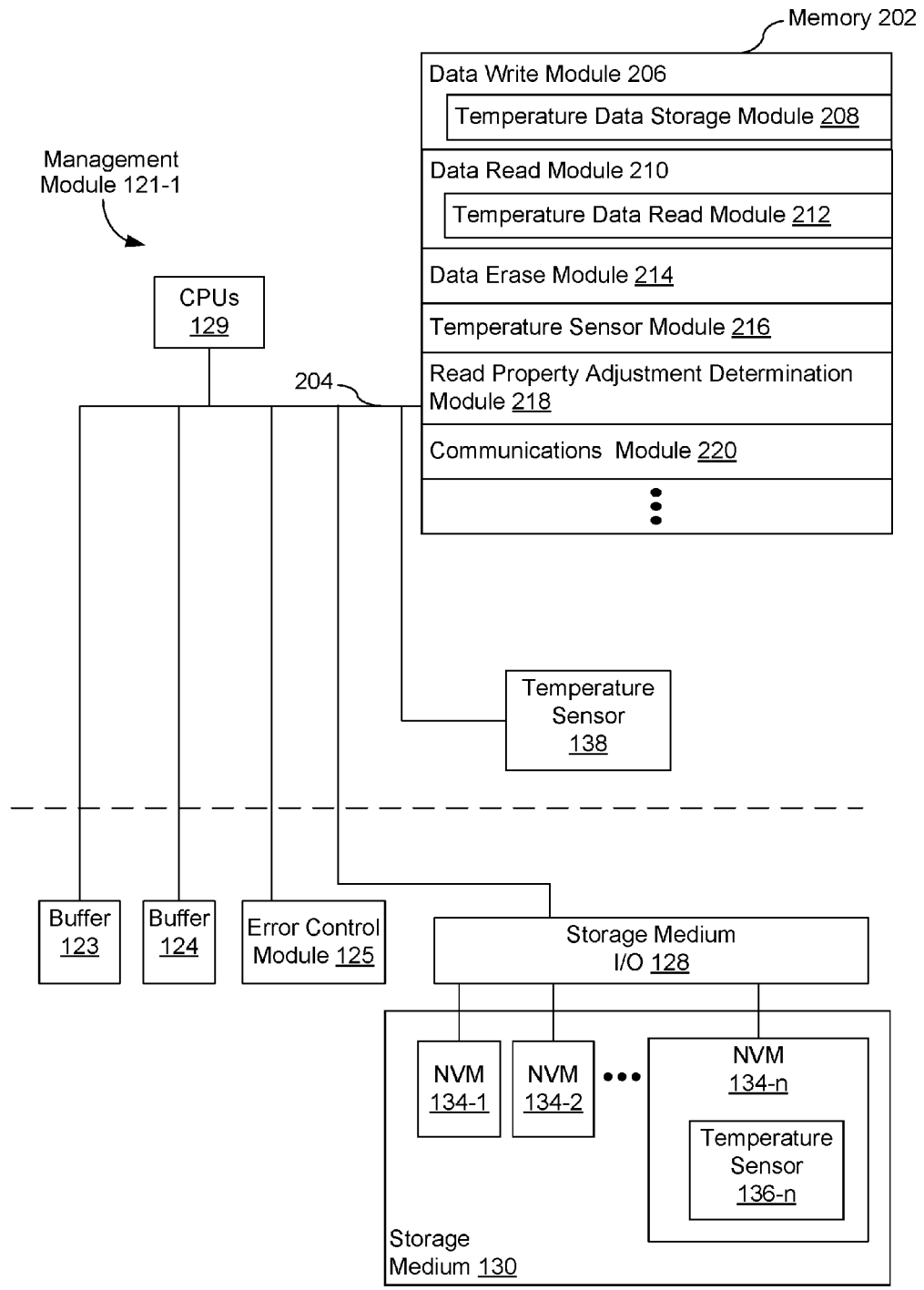
FIG. 2 is a block diagram illustrating an implementation of a management module, in accordance with some embodiments.

FIG. 2 is a block diagram illustrating an implementation of a management module 121-1, in accordance with some embodiments. Management module 121-1 typically includes memory 202, one or more CPUs 129 (also sometimes called processors, processing units, microprocessors or microcontrollers) for executing modules, programs and/or instructions stored in memory 202 and thereby performing processing operations, and one or more communication buses 204 for interconnecting these components. Communication buses 204 optionally include circuitry (sometimes called a chipset) that interconnects and controls communications between system components. Memory 202 includes high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory 202 optionally includes one or more storage devices remotely located from CPUs 129. Memory 202, or alternately the non-volatile memory device(s) within memory 202, comprises a non-transitory computer readable storage medium. In some embodiments, memory 202, or the computer readable storage medium of memory 202 stores the following programs, modules, and data structures, or a subset thereof:

data write module 206 for writing data to storage medium 130 (writing data is also referred to herein as "programming"); in some embodiments, data write module 206 includes, or operates in conjunction with:
  temperature data storage module 208 for storing temperature data corresponding to a detected temperature;
data read module 210 for reading data from storage medium 130; in some embodiments, data read module 210 includes, or operates in conjunction with:
  temperature data read module 212 for retrieving previously stored temperature data;
data erase module 214 for erasing data from storage medium 130;
temperature sensor module 216 for detecting a temperature sensed by temperature sensor 136 and/or 138;
read property adjustment determination module 218 for:
  comparing a value corresponding to a detected temperature with retrieved previously stored temperature data, and
  determining whether to perform a read using an adjusted read property (in some embodiments, in response to a determination to perform a read using the adjusted read property, a subsequent write is performed using an adjusted write property, and/or a subsequent erase is performed using an adjusted erase property);
communications module 220 that is used for communicating with other computer systems or computer components (e.g., via buffers 123, 124 and/or storage medium I/O interface 128).

In some embodiments, a program request is received by storage device 120 (e.g., from computer system 110), such as a program request to write data to a selectable portion of memory 131. In response to receiving the program request, temperature sensor module 216 senses a temperature of a location in storage device 120, using temperature sensor 136 of non-volatile memory 134 (e.g., temperature sensor 136-$n$ of non-volatile memory 134-$n$) and/or temperature sensor 138 of management module 121-1. Temperature data storage module 208 stores data corresponding to the detected temperature, e.g., in a header of data written to the selectable portion of memory 131. After the temperature data is stored, storage device 120 receives a read request, such as a request to read the data previously written to the selectable portion of memory 131. In response to receiving the read request, read property adjustment determination module 218 performs an adjustment determination. The adjustment determination includes detecting, by temperature data read module 212, a new temperature of the location in the storage device 120; retrieving the stored data corresponding to the previously detected temperature; and comparing the new temperature with the temperature value corresponding to the retrieved temperature data.

In some embodiments, a large difference between the new temperature value and the previously stored temperature value indicates that the temperature change will have caused drift of the voltage ranges used to indicate the data written to memory cells. When a temperature change has occurred between when data was written and when the same data is subsequently read, the read results may be inaccurate due to the drift. To read the data more accurately, a read property, such as the read threshold voltage, is adjusted to compensate for the temperature change.

In accordance with a determination by read property adjustment determination module 218 to perform the read using an adjusted read property, the read is performed by data read module 210 on the selectable portion of memory 131 using the adjusted read property (e.g., the adjusted read threshold voltage). In accordance with a determination by read property adjustment determination module 218 not to perform the read using an adjusted read property, the read is performed by data read module 210 on the selectable portion of memory 131 using a default read property (e.g., using the default read threshold voltage).

Each of the above identified elements (e.g., modules 206, 208, 210, 212, 214, 216, 218, and 220) may be stored in one or more of the previously mentioned memory devices that together form memory 202, and corresponds to a set of instructions for performing a function described above. The above identified modules or programs (i.e., sets of instructions) need not be implemented as separate software programs, procedures or modules, and thus various subsets of these modules may be combined or otherwise re-arranged in various embodiments. In some embodiments, memory 202 may store a subset of the modules and data structures identified above. Furthermore, memory 202 may store additional modules and data structures not described above. In some embodiments, the programs, modules, and data structures stored in memory 202, or the computer readable storage medium of memory 202, provide instructions for implementing respective operations in the methods described below. In some embodiments, some or all of these modules may be implemented with specialized hardware circuits that subsume part or all of the module functionality. One or more of the above identified elements may be stored by management module 121-2 of computer system 110 and/or executed by one or more CPUs of computer system 110.

Although FIG. 2 shows management module 121-1, FIG. 2 is intended more as a functional description of the various features which may be present in a management module than as a structural schematic of the embodiments described herein. In practice, and as recognized by those of ordinary skill in the art, items shown separately could be combined and some items could be separated.

The terms "cell voltage" and "memory cell voltage," in the context of flash memory cells, typically means the threshold voltage of the memory cell, which is the minimum voltage that needs to be applied to the gate of the memory cell's transistor in order for the transistor to conduct current. Similarly, reading threshold voltages (sometimes also called reading signals, reading voltages, and/or read thresholds) applied to a flash memory cells are gate voltages applied to the gates of the flash memory cells to determine whether the memory cells conduct current at that gate voltage. In some embodiments, when a flash memory cell's transistor conducts current at a given reading threshold voltage, indicating that the cell voltage is less than the reading threshold voltage, the raw data value for that read operation is a "1," and otherwise the raw data value is a "0."

Figure 3A:
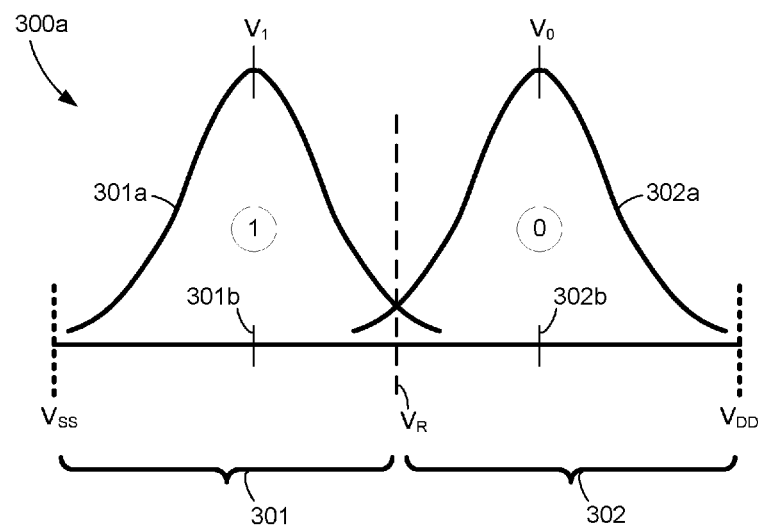
FIG. 3A is a prophetic diagram of voltage distributions that may be found in a single-level flash memory cell (SLC) over time, in accordance with some embodiments.

FIG. 3A is a simplified, prophetic diagram of voltage distributions 300$a$ found in a set of single-level flash memory cells (SLC) over time, in accordance with some embodiments. The voltage distributions 300$a$ shown in FIG. 3A have been simplified for illustrative purposes. In this example, the SLC's cell voltage range extends approximately from a first voltage, $V_{SS}$ (e.g., 0 volts), to a maximum allowed gate voltage, $V_{max}$ (e.g., 6 volts). As such, voltage distributions 300$a$ extend between $V_{SS}$ and $V_{max}$. In some embodiments, the voltage distributions 300$a$ may represent a histogram of cell voltages corresponding to SLC memory cells in a respective portion (e.g., a page, word line or block) of flash memory.

Sequential voltage ranges 301 and 302 between voltages $V_{SS}$ and $V_{max}$ are used to represent corresponding bit values "1" and "0," respectively. Each voltage range 301, 302 has a respective center voltage $V_1$ 301b, $V_0$ 302b. As described below, in many circumstances the memory cell current sensed in response to an applied reading threshold voltages is indicative of a memory cell voltage different from the respective center voltage $V_1$ 301b or $V_0$ 302b corresponding to the respective bit value written into the memory cell. Errors in cell voltage, and/or the cell voltage sensed when reading the memory cell, can occur during write operations, read operations, or due to "drift" of the cell voltage between the time data is written to the memory cell and the time a read operation is performed to read the data stored in the memory cell. For ease of discussion, these effects are collectively described as "cell voltage drift." Each voltage range 301, 302 also has a respective voltage distribution 301a, 302a that may occur as a result of any number of a combination of error-inducing factors, examples of which are identified above.

In some implementations, a reading threshold voltage $V_R$ is applied between adjacent center voltages (e.g., applied proximate to the halfway region between adjacent center voltages $V_1$ 301b and $V_0$ 302b). Optionally, in some implementations, the reading threshold voltage is located between voltage ranges 301 and 302. In some implementations, reading threshold voltage $V_R$ is applied in the region proximate to where the voltage distributions 301a and 302a overlap, which is not necessarily proximate to the halfway region between adjacent center voltages $V_1$ 301b and $V_0$ 302b.

In order to increase storage density in flash memory, flash memory has developed from single-level (SLC) cell flash memory to multi-level cell (MLC) flash memory so that two or more bits can be stored by each memory cell. As discussed below with reference to FIG. 3B, an MLC flash memory device is used to store multiple bits by using voltage ranges within the total voltage range of the memory cell to represent different bit-tuples. An MLC flash memory device is typically more error-prone than an SLC flash memory device created using the same manufacturing process because the effective voltage difference between the voltages used to store different data values is smaller for an MLC flash memory device. Moreover, due to any number of a combination of factors, such as electrical fluctuations, defects in the storage medium, operating conditions, device history, and/or write-read circuitry, a typical error includes a stored voltage level in a particular MLC being in a voltage range that is adjacent to the voltage range that would otherwise be representative of the correct storage of a particular bit-tuple. As discussed in greater detail below with reference to FIG. 3B, the impact of such errors can be reduced by gray-coding the data, such that adjacent voltage ranges represent single-bit changes between bit-tuples.

Figure 3B:
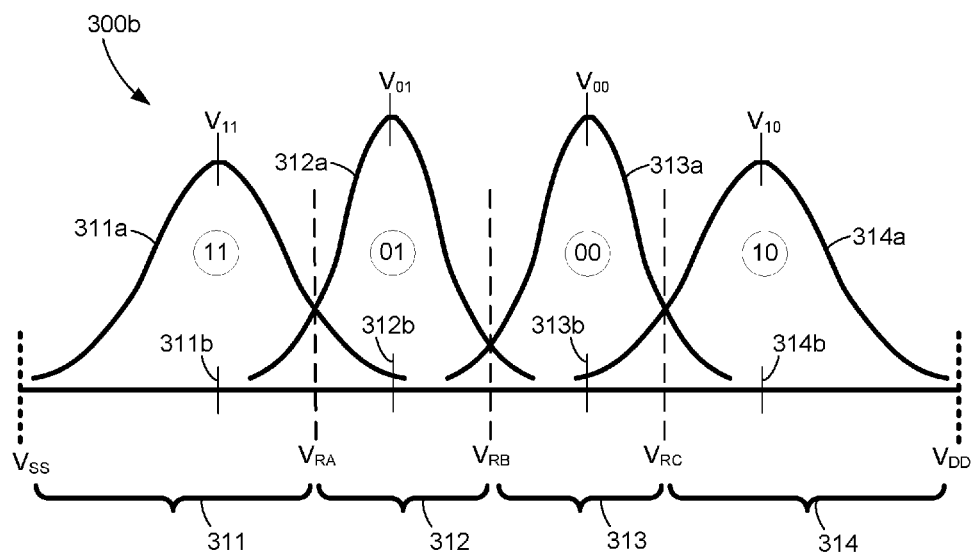
FIG. 3B is a prophetic diagram of voltage distributions that may be found in a multi-level flash memory cell (MLC) over time, in accordance with some embodiments.

FIG. 3B is a simplified, prophetic diagram of voltage distributions 300b found in a set of multi-level flash memory cells (MLC) over time, in accordance with some embodiments. The voltage distributions 300b shown in FIG. 3B have been simplified for illustrative purposes. In this example, the MLC's cell voltage range extends approximately from a first voltage, $V_{SS}$, to a maximum allowed gate voltage, $V_{max}$. As such, voltage distributions 300b extend between $V_{SS}$ and $V_{max}$. In some embodiments, the voltage distributions 300b may represent a histogram of cell voltages corresponding to MLC memory cells in a respective portion (e.g., a page, word line or block) of flash memory.

Sequential voltage ranges 311, 312, 313, 314 between voltages $V_{SS}$ and $V_{max}$ are used to represent corresponding bit-tuples "11," "01," "00," "10," respectively. Each voltage range 311, 312, 313, 314 has a respective center voltage 311b, 312b, 313b, 314b. Each voltage range 311, 312, 313, 314 also has a respective voltage distribution 311a, 312a, 313a, 314a that may occur as a result of any number of a combination of factors, such as electrical fluctuations, defects in the storage medium, operating conditions, device history (e.g., number of program-erase (PE) cycles performed during the lifetime of the device or lifetime of a respective memory portion, and/or number of read operations performed since the last erase operation on the respective memory portion), and/or imperfect performance or design of write-read circuitry.

Ideally, during a write operation, the charge on the floating gate of the MLC would be set such that the resultant cell voltage is at the center of one of the ranges 311, 312, 313, 314 in order to write the corresponding bit-tuple to the MLC. Specifically, the resultant cell voltage would be set to one of $V_{11}$ 311b, $V_{01}$ 312b, $V_{00}$ 313b and $V_{10}$ 314b in order to write a corresponding one of the bit-tuples "11," "01," "00" and "10." In reality, due to the factors mentioned above, the initial cell voltage may differ from the center voltage for the data written to the MLC.

Reading threshold voltages $V_{RA}$, $V_{RB}$ and $V_{RC}$ are positioned between adjacent center voltages (e.g., positioned at or near the halfway point between adjacent center voltages) and, thus, define threshold voltages between the voltage ranges 311, 312, 313, 314. Optionally, in some implementations, the reading threshold voltages are located between adjacent voltage ranges 311, 312, 313, 314. In some implementations, reading threshold voltages $V_{RA}$, $V_{RB}$, and $V_{RC}$ are applied in the regions proximate to where adjacent voltage distributions 311a, 312a, 313a, 314a overlap, which are not necessarily proximate to the halfway regions between adjacent center voltages $V_{11}$ 311b, $V_{01}$ 312b, $V_{00}$ 313b and $V_{10}$ 314b. In some implementations, the reading threshold voltages are selected or adjusted to minimize error. During a read operation, one of the reading threshold voltages $V_{RA}$, $V_{RB}$ and $V_{RC}$ is applied to determine the cell voltage using a comparison process. However, due to the various factors discussed above, the actual cell voltage, and/or the cell voltage received when reading the MLC, may be different from the respective center voltage $V_{11}$ 311b, $V_{01}$ 312b, $V_{00}$ 313b or $V_{10}$ 314b corresponding to the data value written into the cell. For example, the actual cell voltage may be in an altogether different voltage range, strongly indicating that the MLC is storing a different bit-tuple than was written to the MLC. More commonly, the actual cell voltage may be close to one of the read comparison voltages, making it difficult to determine with certainty which of two adjacent bit-tuples is stored by the MLC.

Errors in cell voltage, and/or the cell voltage received when reading the MLC, can occur during write operations, read operations, or due to "drift" of the cell voltage between the time data is written to the MLC and the time a read operation is performed to read the data stored in the MLC. For ease of discussion, sometimes errors in cell voltage, and/or the cell voltage received when reading the MLC, are collectively called "cell voltage drift."

One way to reduce the impact of a cell voltage drifting from one voltage range to an adjacent voltage range is to gray-code the bit-tuples. Gray-coding the bit-tuples includes constraining the assignment of bit-tuples such that a respective bit-tuple of a particular voltage range is different from a respective bit-tuple of an adjacent voltage range by only one bit. For example, as shown in FIG. 3B, the corresponding bit-tuples for adjacent ranges 301 and 302 are respectively "11" and "01," the corresponding bit-tuples for adjacent ranges 302 and 303 are respectively "01" and "00," and the corresponding bit-tuples for adjacent ranges 303 and 304 are respectively "00" and "10." Using gray-coding, if the cell voltage drifts close to a read comparison voltage level, the error is typically limited to a single bit within the 2-bit bit-tuple.

Although the description of FIG. 3B uses an example in which q=2 (i.e., 2 bits per cell in an MLC flash memory), those skilled in the art will appreciate that the embodiments described herein may be extended to memory cells that have more than four possible states per cell, yielding more than two bits of information per cell. For example, in some embodiments, a triple-level memory cell (TLC, also referred to as X3) has eight possible states per cell, yielding three bits of information per cell. As another example, in some embodiments, a quad-level memory cell (QLC, also referred to as X4) has 16 possible states per cell, yielding four bits of information per cell. As another example, in some embodiments, a cell might store only 6 states, yielding approximately 2.5 bits of information per cell, meaning that two cells together would provide 36 possible states, more than sufficient to store 5 bits of information per pair of cells.

Figure 4:
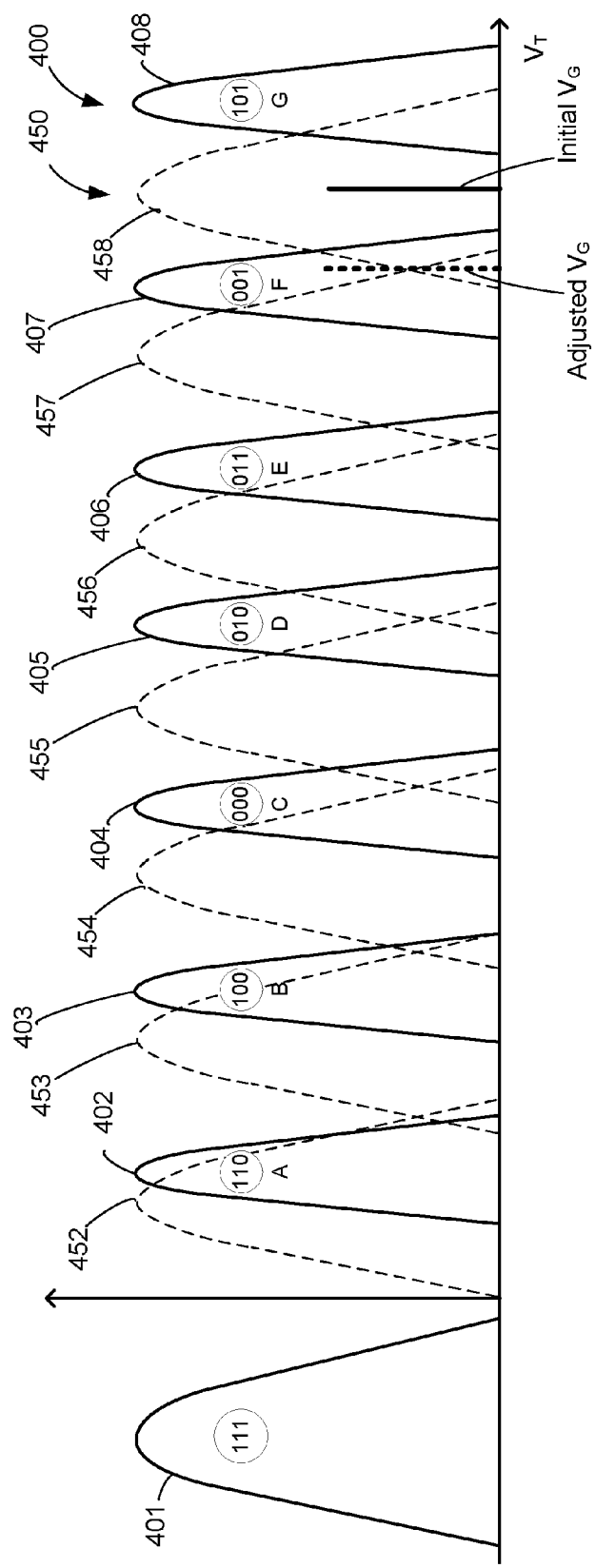
FIG. 4 is a prophetic diagram illustrating a drift in a set of voltage distributions of triple-level flash memory cell (TLC) due to a temperature increase, in accordance with some embodiments.

FIG. 4 is a prophetic diagram illustrating a drift in a set of voltage distributions due to a temperature increase between a first time at which a TLC is programmed and a second time, subsequent to the first time, at which the TLC is read, in accordance with some embodiments. Voltage distributions 400, shown with solid lines, indicate voltage distributions of a TLC programmed at a low temperature. Voltage distributions 450, shown with dotted lines, indicate voltage distributions of a TLC after the temperature of the TLC has increased. Sequential voltage ranges 401, 402, 403, 404, 405, 406, 407, and 408 are used to represent corresponding bit-tuples "111," "110," "100," "000," "010," "011," "001," and "101," respectively, at a first time when the TLC is programmed at a low temperature. Sequential voltage ranges 452, 453, 454, 455, 456, 457, and 458 indicate the locations to which the voltage ranges representing bit-tuples "111," "110," "100," "000," "010," "011," "001," and "101," respectively, have drifted after a temperature increase. The voltage ranges representing bit-tuples "111," "110," "100," "000," "010," "011," "001," and "101," are also referred to herein as voltage ranges "A," "B," "C," "D," "E," "F," and "G," respectively. Cell voltage drift due to temperature fluctuations, such as the drift illustrated in FIG. 4, may give rise to erroneous reads of data from storage medium 130. For example, if a reading threshold voltage at a location indicated by "Initial $V_G$" is located between voltage distributions 407 and 408, based on the locations of the voltage distributions F and G at the time the data was written to the cell, read results may be inaccurate due to the drift of voltage distributions F and G to locations 457 and 458 as a result of a temperature increase prior to the read. A more accurate read may be obtained by adjusting the reading threshold voltage to a location indicated by "Adjusted $V_G$" between voltage distributions 457 and 458.

In some embodiments, to determine whether to perform a read using an adjusted read property (e.g., an adjusted read voltage such as "Adjusted $V_G$"), a device compares a current temperature value (e.g., a value corresponding to a temperature detected by temperature sensor 136, 138), to a previously stored temperature value. In some embodiments, a temperature value is stored as a series of bits, also referred to herein as a series of "temperature indication bits." Each temperature indication bit of the series of bits indicating the temperature value is stored in an individual memory cell. In some embodiments, an individual memory cell stores a programmed value for a temperature indication bit by programming the cell voltage to a voltage range C or higher (e.g., setting the charge on the floating gate of the cell such that the resultant cell voltage falls within range C, D, E, F, or G as indicated by FIG. 4). Programming the cell voltage to range C or higher to indicate that a temperature indication bit is a programmed bit allows temperature indication bit values to be determined with a high degree of accuracy even after temperature fluctuations have occurred. This is because the separation between the cell voltage range 111, indicating an erased state of the cell, and cell voltage range C (a higher charge level than the charge level to set cell voltage to range A or B), indicating a programmed state of the cell, reduces the likelihood of an incorrect read result even if the voltage ranges have drifted due to temperature changes.

FIG. 5 is a prophetic diagram illustrating a temperature data storage table 500 indicating a series of temperature indication bits that correspond to temperature ranges, in accordance with some embodiments. The Temperature Range Value column of temperature data storage table 500 indicates a value corresponding to a temperature range. The Number of Cells Having Erased State column of temperature data storage table 500 indicates a number of cells having an erased state; the number of cells having the erase state is used to store an indication of a temperature range.

In an illustrative example, a temperature sensor (e.g., temperature sensor 136 or 138) detects a temperature of 35° C. In accordance with temperature data storage table 500, 35° C. falls within the temperature range 31-40, so the temperature range value for the detected temperature is 4. To indicate the temperature range value using a series of bits, eight memory cells (referred to as cell 0 through cell 7 in the temperature data cell state portion of temperature data storage table 500) are used. Of the eight memory cells used to indicate the temperature range value, cell 0, cell 1, cell 2, and cell 3 are each assigned a programmed state. For example, each of cell 0, cell 1, cell 2, and cell 3 are programmed at a cell voltage range of C or higher in the respective TLC, as indicated in the row corresponding to temperature range value 4 of temperature data storage table 500. An erased state (e.g., "111") is assigned to cell 4, cell 5, cell 6, and cell 7 of the eight memory cells used to indicate the temperature range value. In some embodiments, temperature values are stores as a type of Gray code, one example of which is shown in FIG. 5.

Figure 6:
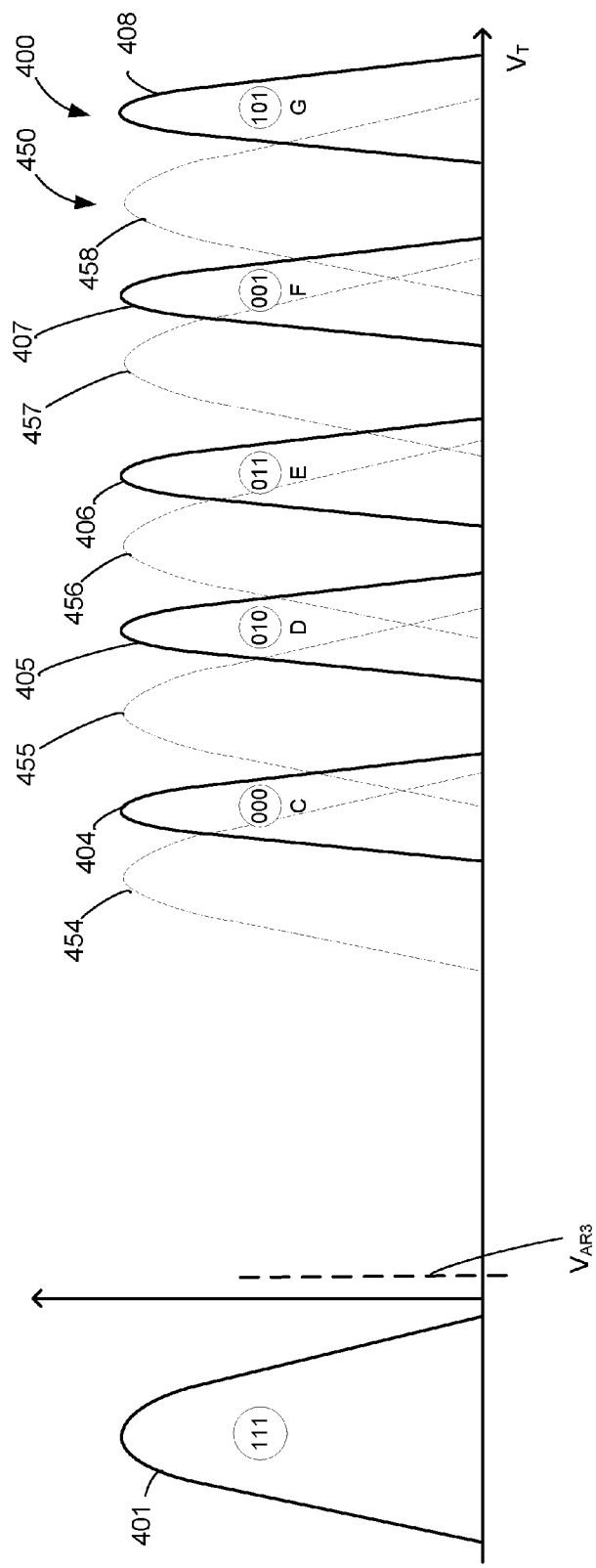
FIG. 6 is a prophetic diagram illustrating of a read operation illustrates a read performed on a memory cell used as a temperature indication bit, in accordance with some embodiments.

FIG. 6 is a prophetic diagram illustrating a read operation performed on a memory cell used as a temperature indication bit, in accordance with some embodiments. As discussed above with regard to FIGS. 4 and 5, a respective cell of a series of bits indicating a temperature range value is either erased (e.g., the memory cell is charged such that the resultant cell voltage is in the voltage range representing "111") or is programmed to a level of cell voltage range C or higher (e.g., the memory cell is charged such that the resultant cell voltage is in voltage range C, D, E, F, or G, as indicated in FIG. 6). FIG. 6 indicates the wide separation between voltage range 111 and cell voltage ranges C and higher. In some embodiments, a read to determine whether the cell is programmed or erased is performed at a voltage level $V_{AR3}$ (e.g., a threshold voltage level at or near the lower end of voltage range A). When the read at voltage level $V_{AR3}$ has been performed on each memory cell corresponding to a bit of the series of temperature indication bits for a respective memory portion, the previously stored temperature range value (stored when data was stored to the respective memory portion) can be determined based on the read results from the temperature indication bits.

For example, referring to temperature data storage table 500, if three of the bits in the series of temperature indication bits for a respective memory portion have an erased state, the stored temperature range value is 5, indicating a temperature range of 51-60° C. when data was stored to the respective memory portion. The retrieved temperature range value is compared with a current temperature range value to determine whether an adjusted read property (e.g., adjusted reading threshold voltages) is needed for performing reads of data, sometimes called host data or user data, from the respective memory portion.

In some embodiments, as discussed further below with regard to FIG. 8, a read at a voltage level $V_{AR3}$ is used to determine whether data values, comprising data values other than the set of temperature bit values, stored in a set of memory cells are determinable without using adjusted read levels. For example, in a TLC memory portion corresponding to a word line, a read at a voltage level $V_{AR3}$ is performed on each memory cell of the word line. The number of memory cells in the word line for which the read at voltage level $V_{AR3}$ indicates a programmed state is compared with the total number of cells in the word line to establish a ratio. If the ratio is approximately 87.5% (e.g., within a particular range of 87.5% such as within 87.5%+/−1% or within 87.5%+/−1.5%), values read using a set of default read thresholds, which typically includes the $V_{AR3}$ voltage level, are usable for reading data from the respective memory portion. In this way, the read at voltage level $V_{AR3}$ is used both to retrieve data values from the respective memory portion (i.e., to read data using multiple default reading threshold voltages, including the $V_{AR3}$ voltage level) and for determination of the value (programmed/erased) of the bits in the series of temperature information bits. If the ratio is not within the particular range of 87.5%, an adjusted read property will be needed to retrieve data values (e.g., values, other than the temperature information bits) from the memory cells in the respective memory portion.

Figure 7A:
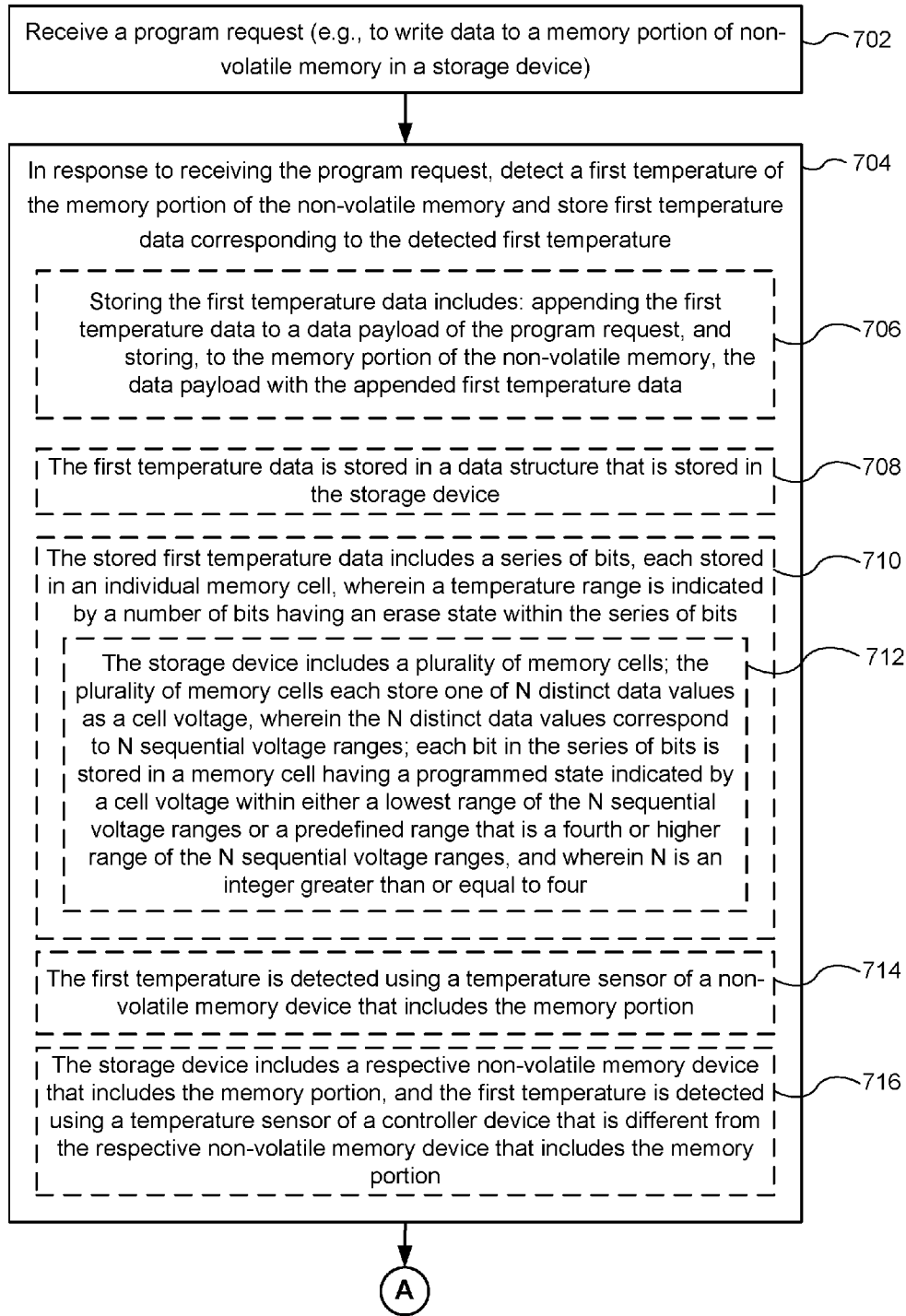
FIGS. 7A-7C illustrate a flowchart representation of a method for adjusting a read property for a memory portion of non-volatile memory in a storage device, in accordance with some embodiments.
Figure 7B:
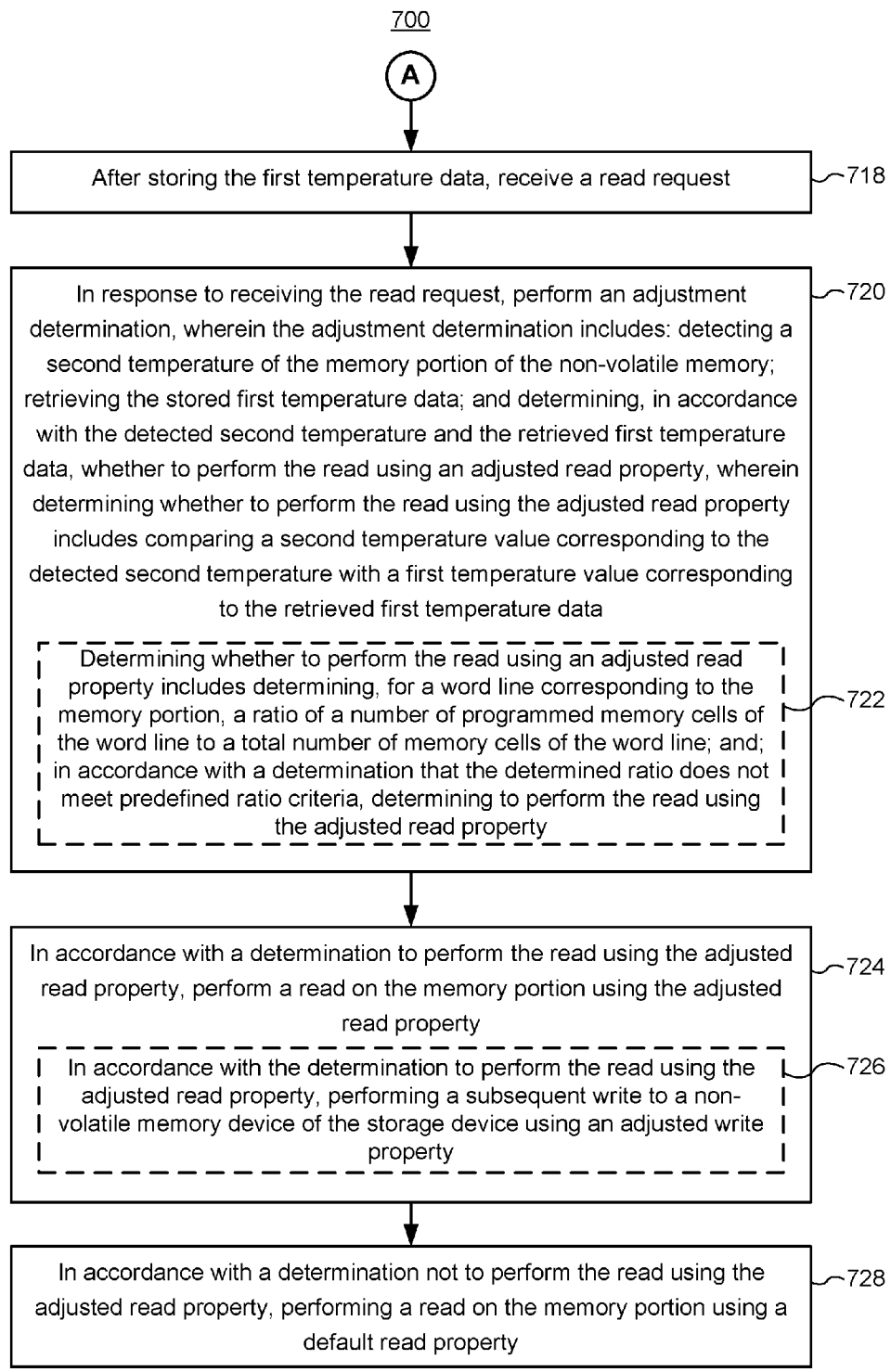
Figure 7C:
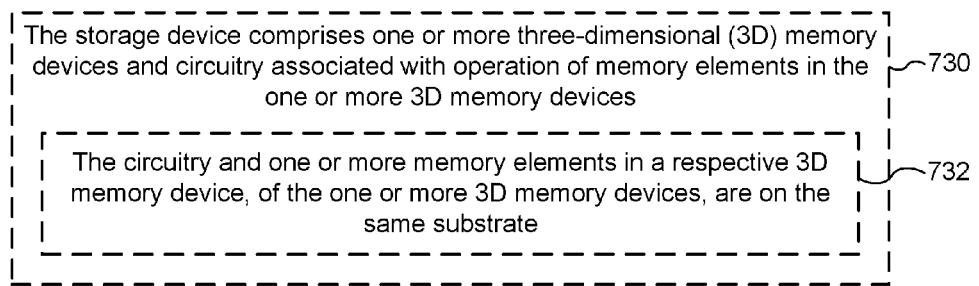

FIGS. 7A-7C illustrate a flowchart representation of a method 700 for adjusting a read property for a memory portion of non-volatile memory in a storage device, in accordance with some embodiments. At least in some implementations, one or more steps of method 700 are performed by a storage device (e.g., storage device 120, FIG. 1) one or more components of the storage device (e.g., storage controller 122 and/or management module 121-1, FIG. 1), or computer system 110. In some embodiments, the memory portion of the non-volatile memory in the storage device is selectable portion of storage medium 131. For ease of explanation, "device" is used in the description of method 700 to refer to a storage device, components of the storage device, and/or computer system 110. In some embodiments, method 700 is governed by instructions that are stored in a computer readable storage medium (e.g., a non-transitory computer readable storage medium) and that are executed by one or more processors of a device, such as the one or more processors 129 of management module 121-1 (FIG. 1 or FIG. 2) in storage controller 122, and/or the one or more processors of computer system 110 (not shown).

In some embodiments, the device receives (702) a program request. For example, the program request specifies a data payload to be written to a respective memory portion of non-volatile memory in a storage device, and is received by storage controller 122 of storage device 120 from computer system 110 via data connections 101.

In response to receiving the program request, the device detects (704) a first temperature of the memory portion of the non-volatile memory and stores first temperature data corresponding to the detected first temperature. For example, temperature sensor module 216 detects the first temperature by obtaining output of a temperature sensor. In some embodiments, the device detects the first temperature using temperature sensor 136 of a non-volatile memory device (e.g., using temperature sensor 136-n of NVM 134-n). In some embodiments, the device detects the first temperature using temperature sensor 138 of a storage controller 122. In some embodiments, the first temperature data indicates or, more generally, corresponds to the detected first temperature. In some embodiments, the first temperature data indicates a range of temperatures (e.g., as indicated in temperature data storage table 500) corresponding to (e.g., that includes) the detected first temperature.

In some embodiments, storing the first temperature data includes appending (706) the first temperature data to a data payload (e.g., host data, user data, or the like, typically encoded as one or more codewords) of the program request and storing, to the memory portion of the non-volatile memory, the data payload with the appended first temperature data. For example, in some embodiments, temperature data storage module 208 stores the first temperature data in a header of a data payload of the received program request. For example, in some embodiments the data payload includes one or more codewords. The header, including the first temperature data, is appended to the one or more codewords, and thus the first temperature data is not part of the one or more codewords, but rather comprises data that is in addition to the one or more codewords. In some embodiments, appending the first temperature data to the data payload occurs after encoding of a codeword has occurred. For example, the first temperature data is appended to the data payload after host data has been encoded by encoder 126 to generate a codeword that is, or is part of, the data payload. However, in some other embodiments, the first temperature data are included in the one or more codewords of the data payload.

Data write module 206 writes the data payload, including the header with the first temperature data, to NVM 134 (e.g., selectable portion 131 of NVM 134-n).

In some embodiments, the first temperature data is stored (708) in a data structure stored by the storage device 120. For example, temperature data storage module 208 stores the first temperature data in a data structure such as a table or B-tree, separate from the host data or user data received with the program request. The data structure is stored in, e.g., storage medium 130, other memory of storage device 120, or memory of computer system 110. In some embodiments, the first temperature is stored at a location in the data structure that includes or indicates identifying information for the memory portion. For example, an entry of a table stored by the non-volatile memory includes the first temperature data and identifying information for the memory portion to which the data payload is written in response to the program request, thereby recording the temperature of the memory portion while the data payload is written to the memory portion. In some embodiments, the data structure is a data structure used (e.g., used exclusively) for storing temperature data.

In some embodiments, the stored first temperature data includes (710) a series of bits, each stored in an individual memory cell, wherein a temperature range is indicated by a number of bits having an erase state within the series of bits. A temperature range is, for example, a temperature range spanning 1° C., 5° C., 10° C. (as shown in the temperature data storage table 500), 25° C., or another temperature range. In some embodiments, when a detected temperature corresponds to a temperature range (e.g., greater than or equal to a lower temperature of the temperature range and less than an upper temperature of the temperature range; or, alternatively, greater than a lower temperature of the temperature range and less than or equal to an upper temperature of the temperature range), stored first temperature data indicates a value corresponding to the temperature range. For example, in accordance with temperature data storage table 500, first temperature data corresponding to a detected temperature of 28° C. is stored as a series of temperature information bits (corresponding to respective memory cells) including three memory cells having a programmed state and five memory cells having an erased state.

In some embodiments, the storage device includes (712) a plurality of memory cells. The plurality of memory cells each store one of N distinct data values as a cell voltage, wherein the N distinct data values correspond to N sequential voltage ranges. For example, an MLC memory cell stores one of four distinct data values (N=4), as indicated by bit tuples 11, 01, 00, and 10 of FIG. 3B. A TLC stores one of eight distinct data values (N=8), as indicated by bit tuples 111, 110 (A), 100 (B), 000 (C), 010 (D), 011 (E), 001 (F), and 101 (G) of FIG. 4. Each bit in the series of bits is stored in a memory cell having a programmed state indicated by a cell voltage within either a lowest range of the N sequential voltage ranges (e.g., 11 of the MLC of FIG. 3B; or 111 of the TLC of FIG. 4) or a predefined range that is a fourth or higher range of the N sequential voltage ranges (e.g., 10 of the MLC of FIG. 3B; or any of C-G of the TLC of FIG. 4) and wherein N is an integer greater than or equal to four. For example, the first voltage range corresponds to the erased state, typically representing a value "111" in a TLC cell. By maintaining a division between the voltage range indicating the erase state of the memory cell and the voltage ranges (at C or above) used to indicate a programmed state of the memory cell, it is possible to read a correct value from the memory cell even when large changes in temperature cause the voltage ranges to drift. In this way, effects of temperature swings on reading of the stored first temperature data are mitigated.

In some embodiments, when a temperature information bit is written, a memory cell is assigned an erased state (such that the memory cell voltage is within "erased" voltage range "111") or a programmed state (such that the memory cell voltage is within voltage range "C" or higher). When the temperature data is retrieved, the memory cell is read using a single reading threshold voltage (e.g., $V_{AR3}$) to determine whether the temperature information bit has a programmed state or an erased state. Because of the large separation between voltage range "111" and voltage range "C," the reading of the temperature information bit is minimally affected by temperature variations affecting the memory cell.

In some embodiments, the first temperature is detected (714) using a temperature sensor of a non-volatile memory device that includes the memory portion (e.g., a die level sensor.) For example, the first temperature is detected using temperature sensor 136-*n* of NVM 134-*n*, which includes selectable portion 131, as shown in FIG. 1.

In some embodiments, the storage device includes (716) a respective non-volatile memory device that includes the memory portion, and the first temperature is detected using a temperature sensor of a controller device that is different from the respective non-volatile memory device that includes the memory portion. For example, in some embodiments, storage device 120 includes storage medium 130, and the first temperature is detected using temperature sensor 138 of management module 121-1 that is different from storage medium 130, as shown in FIG. 1.

After storing the first temperature data, the device receives (718) a read request. For example, a read request is received by storage controller 122 from computer system 110 via data connections 101.

In response to receiving the read request, the device performs (720) an adjustment determination. The adjustment determination includes detecting (720) a second temperature of the memory portion of the non-volatile memory. For example, temperature sensor module 216 detects the second temperature by obtaining output of a temperature sensor. In some embodiments, the device detects the second temperature using temperature sensor 136 of a non-volatile memory device (e.g., using temperature sensor 136-*n* of NVM 134-*n*). In some embodiments, the device detects the second temperature using temperature sensor 138 of a storage controller 122.

The adjustment determination further includes retrieving (720) the stored first temperature data. In some embodiments, temperature data read module 212 retrieves stored first temperature data from appended data (e.g., a header) of a data stored in NVM 134 (e.g., at a location in NVM 134 determined from the read request), as described with regard to 706. For example, retrieving the stored first temperature data includes reading the appended temperature (e.g., temperature data from the header) during a normal read performed by data read module 210 or with a "read ahead" performed by data read module 210. In some embodiments, temperature data read module 212 retrieves temperature data from a data structure as described with regard to 708.

The adjustment determination further includes determining (720), in accordance with the detected second temperature and the retrieved first temperature data, whether to perform the read using an adjusted read property, wherein determining whether to perform the read using an adjusted read property includes comparing a second temperature value corresponding to the detected second temperature with a first temperature value corresponding to the retrieved first temperature data. For example, a determination to perform the read using the adjusted read property is reached when the second temperature value differs from the first temperature value by, e.g., at least one temperature range value as described with reference to temperature data storage table 500. In some embodiments, the second temperature value is, e.g., the detected second temperature, a temperature range corresponding to the second temperature, or a representative temperature for that range. In some embodiments, the first temperature value is, e.g., a stored indication of (e.g., a series of temperature indication bits) the temperature range corresponding to the detected first temperature. In some embodiments, the adjusted read property is an adjusted read threshold voltage and/or an adjusted read timing.

In some embodiments, the magnitude of a read threshold voltage adjustment is based on an algorithm defining a relationship between temperature change magnitude and read voltage adjustment value. In some embodiments, the magnitude of a read threshold voltage adjustment is determined from a data structure, such as a table, indicating an amount by which to change a read voltage in accordance with a determined change in temperature. It will be recognized that many alternative approaches could be used for determining a magnitude of an adjusted read property.

In some embodiments, determining whether to perform the read using an adjusted read property includes determining (722), for a word line corresponding to the memory portion, a ratio of a number of programmed memory cells on the word line (or alternatively, programmed bits of the word line) to a total number of memory cells on the word line (or alternatively, a total number of bits of the word line); and, in accordance with a determination that the determined ratio does not meet predefined ratio criteria, determining to perform the read using the adjusted read property. In such embodiments, there is a presumption that the values in codewords or a data payload written to the word line is "DC-balanced" or "bit balanced," meaning that the number of 0 bits (i.e., bits equal to zero) is equal (e.g., within a predefined margin, such as 0.1 percent) to the number of 1 bits (i.e., bits equal to 1). As a result, when such codewords are written to a memory portion in which three bits are stored in each cell, approximately 12.5 percent (i.e., one eighth) of the memory cells will be in an erased state (equal to "111") and the remaining 87.5 percent (i.e., seven eighth) of the memory cells will be in a programmed state (i.e., equal to a value other than "111"), where the values 12.5 percent and 87.5 percent are understood to be plus or minus a predefined margin, such as 0.1 percent.

For example, to make the determination needed for operation 722, data read module 210 performs a read at voltage level $V_{AR3}$ (e.g., as described with reference to FIG. 6) of all the memory cells of the word line to which one or more codewords (or a data payload) have been written. For ease of discussion, the term "data storing memory cells" is used to mean, or indicate, all the memory cells of the word line to which one or more codewords (or a data payload) have been written. In some embodiments, the same read operation, using the $V_{AR3}$ read voltage, is used to both read the temperature information bits, if any, stored on the word line, and to determine the percentage of data storing memory cells on the word line that are erased (e.g., have a cell voltage that falls within the "111" range) and/or the percentage of data storing memory cells on the word line that are programmed (e.g., have a cell voltage is above the "111" range). In some embodiments, the predefined ratio criteria are met when the ratio of programmed data storing memory cells to total data storing memory cells is approximately 87.5%, such as 87.5% (+/−1%) or 87.5% (+/−1.5%). In such embodiments, when the ratio is approximately 87.5%, data stored on the word line can be read using a default read property (e.g., a set of default read threshold voltages), but when the ration is not approximately 87.5%, data stored on the word line will need to be read using an adjusted read property, distinct from the default read property. For example, the adjusted read property is a set of read threshold voltages adjusted in accordance a difference between a current temperature value for the memory portion and the first stored temperature value for the memory portion, which corresponds to the temperature of the memory portion when data was stored to the memory portion.

Furthermore, it is noted that to read data stored to a memory portion in which three bits are stored in each memory cell, seven read operations, using seven threshold voltages (i.e., threshold voltages between the eight successive voltage ranges Erased, A, B, C, D, E, F and G, as shown in FIG. 4) are typically required to obtain all the information needed to detect and decode the data stored in those memory cells. When the ratio discussed above is approximately 87.5%, data stored on the word line can be read using a default read property, the read operation used to determine the ratio is used as the first of those seven read operations, and thus six additional read operations are needed. However, when the ratio discussed above is not approximately 87.5%, the read operation used to determine the ratio cannot be used to obtain the information needed to detect and decode the data stored in those memory cells, and instead seven additional read operations, using an adjusted read property, are needed to obtain all the information needed to detect and decode the data stored in those memory cells.

Use of the predefined ratio criteria of 722 is further described with reference to FIG. 8.

In accordance with a determination to perform the read using the adjusted read property, the device performs (724) a read on the memory portion using the adjusted read property. For example, data read module 210 reads data from NVM 134 at a location corresponding to a location indicated by the read request (e.g., a location indicating a selectable portion of storage medium 131) using the adjusted read threshold voltages and/or adjusted read timing.

In some embodiments, in accordance with the determination to perform the read using the adjusted read property, the device performs (726) a subsequent write to a non-volatile memory device of the storage device using an adjusted write property (e.g., an adjusted set of write verify voltages and/or an adjusted write timing property). In some embodiments, the adjusted write property is used only if the subsequent write operation 726 occurs within a predefined period of time, typically ranging between 1 second and 10 minutes, of the read request 718 that resulted in a determination to use an adjusted read property for reading data. Optionally, the subsequent write is performed using the adjusted write property only if the write is to the same NVM 134 from which data was requested by the read request of 718. In some embodiments, the adjusted read property (e.g., adjusted read threshold voltage and/or an adjusted read timing) is applied to subsequent read operations that meet predefined criteria (e.g., if the read is from the same NVM 134 from which data was requested by read request 718, and/or performed within a predefined period of time within of read request 718).

In accordance with a determination not to perform the read using the adjusted read property, the device performs (728) a read on the memory portion using a default read property. For example, data read module 210 reads data from an NVM 134 at a location corresponding to a location indicated by the read request, using, e.g., a default read threshold voltage and/or default read timing.

In some embodiments, the storage device comprises (730) one or more three-dimensional (3D) memory devices and circuitry associated with operation of memory elements in the one or more 3D memory devices.

In some embodiments, the circuitry and one or more memory elements in a respective 3D memory device, of the one or more 3D memory devices, are (732) on the same substrate.

Figure 8:
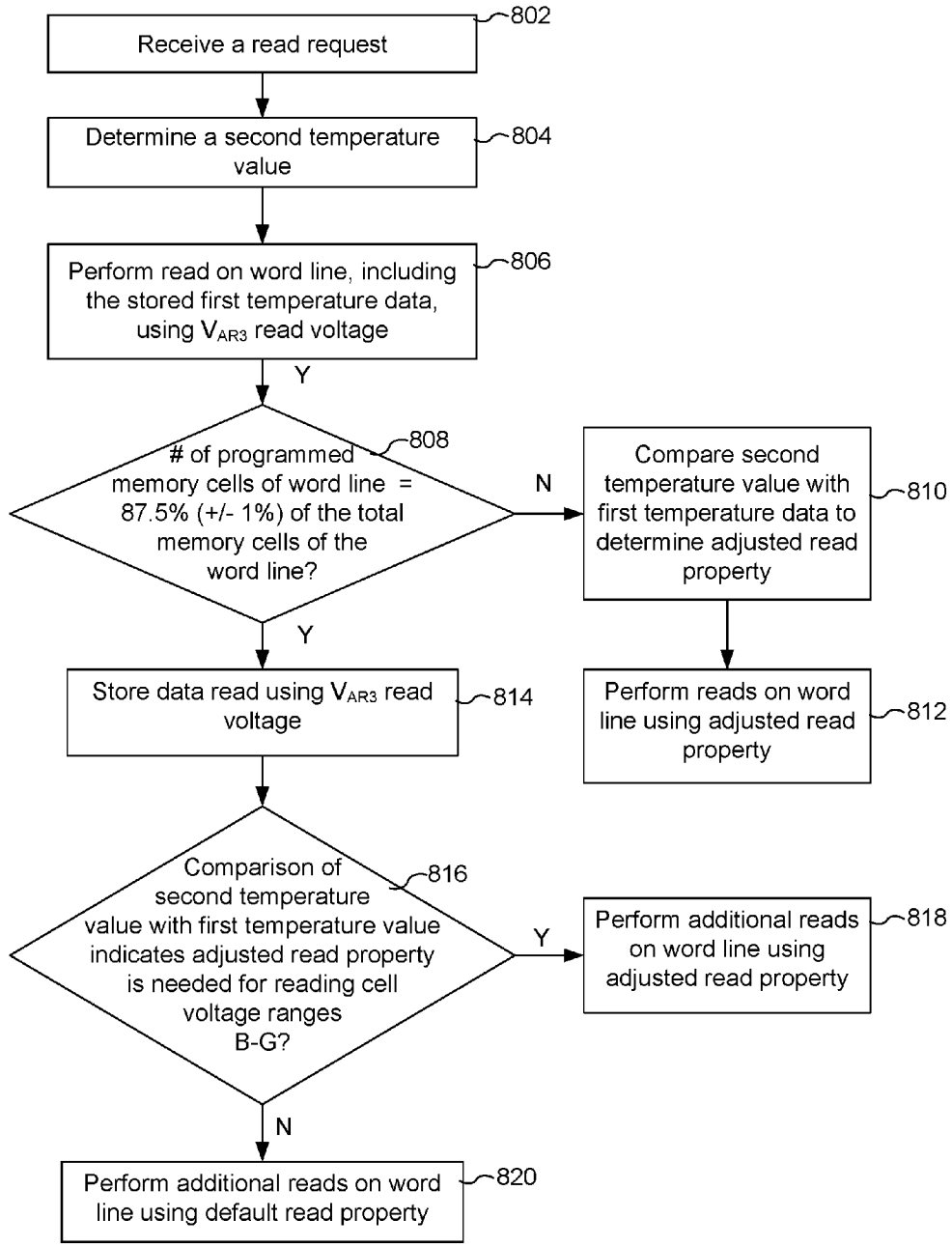
FIG. 8 illustrates a conceptual flowchart representation of a method for adjusting a read property for a memory portion of non-volatile memory in a storage device, in accordance with some embodiments.

FIG. 8 illustrates a conceptual flowchart representation of a method 800 for adjusting a read property for a memory portion of non-volatile memory in a storage device, in accordance with some embodiments. At least in some implementations, one or more steps of method 800 are performed by a storage device (e.g., storage device 120, FIG. 1) one or more components of the storage device (e.g., storage controller 122 and/or management module 121-1, FIG. 1), or a computer system (e.g., computer system 110, FIG. 1) coupled to a storage device. In some embodiments, the memory portion of the non-volatile memory in the storage device is selectable portion of storage medium 131. For ease of explanation, "device" is used in the description of method 800 to refer to a storage device, components of the storage device, and/or computer system 110. In some embodiments, method 800 is governed by instructions that are stored in a computer readable storage medium (e.g., a non-transitory computer readable storage medium) and that are executed by one or more processors of a device, such as the one or more processors 129 of management module 121-1 (FIG. 2) in storage controller 122, and/or the one or more processors of computer system 110 (not shown).

The operations of conceptual flowchart 800 occur after operations 702 and 704 of method 700 have occurred (e.g., first temperature data corresponding to a detected first temperature of a memory portion of a non-volatile memory has already been stored).

In some embodiments, after storing the first temperature data, the device receives (802) a read request (e.g., a read request as described with regard to 718).

In response to receiving the read request, the device determines (804) a second temperature value for the memory portion of the non-volatile memory. For example, temperature sensor module 216 detects the second temperature of the memory portion of the non-volatile memory by obtaining output of a temperature sensor (e.g., temperature sensor 136 or temperature sensor 138) and determines a corresponding second temperature value. The second temperature value indicates, for example, the detected second temperature, a temperature range corresponding to the second temperature, or a representative temperature for that range.

The device retrieves (806) data from a word line, where the retrieved data includes the stored first temperature data (e.g., the first temperature data stored as described with regard to 704), using the $V_{AR3}$ read voltage. For each cell of the word line, data write module 206 performs a read at voltage level $V_{AR3}$ (e.g., as described with reference to FIG. 6) to determine a number of programmed memory cells of the word line (e.g., having a cell voltage in the "A" cell voltage range or higher) and a number of erased memory cells of the word line.

Using the data retrieved (806) from a word line, the device determines (808) whether the number of programmed memory cells (e.g., X3 memory cells) of the word line is approximately 87.5% (e.g., 87.5%+/−1%) of the total number of memory cells (e.g., X3 memory cells) of the word line. For example, if the data stored in memory cells of the word line was encoded using encoding (such as 8*b*/10*b* encoding) to achieve DC-balance, three bits are stored in each of the memory cells (e.g., X3 memory cells) of the word line, and the data stored in the memory cells of the word line is read correctly using the $V_{AR3}$ voltage level (i.e., as a read threshold), then the read using the $V_{AR3}$ voltage level will result in a determination that approximately 87.5% of the memory cells of the word line are programmed. If the number of programmed memory cells of the word line is not approximately 87.5%, method 800 proceeds to operation 810. If the number of programmed memory cells of the word line is approximately 87.5%, method 800 proceeds to operation 814.

At operation 810, because the number of programmed memory cells of the word line is not approximately 87.5%, the data obtained from the read operation performed using the $V_{AR3}$ read voltage (sometimes called the $V_{AR3}$ voltage level or $V_{AR3}$ threshold voltage) is unreliable for purposes of determining the payload data stored in memory cells of the word line, in accordance with some embodiments. However, the obtained data is reliable for determining the values of the temperature indication bits because of the separation between the cell voltage range 111 (erased state) and cell voltage range C (to indicate programmed state). Thus, a first temperature value is determined using the temperature indication bits retrieved from the word line. The second temperature value (determined at 804) is compared (810) with the first temperature value to determine an adjusted read property (e.g., a set of adjusted read thresholds).

At operation 812, the adjusted read property is used for reading data from the memory cells of the word line (e.g., as described with regard to 724-726). In some embodiments, in which the memory cells of the word line are X3 memory cells, seven read operations are performed using seven adjusted threshold voltages between the eight successive voltage ranges used to store data in X3 memory cells (e.g., as shown in FIG. 4).

At operation 814, the data read by operation 806 is stored, for later use in determining the payload data stored in the memory cells of the word line. Because the number of programmed bits of the word line is approximately 87.5% (808—Yes), the data obtained by reading the memory cells of the word line using the $V_{AR3}$ read voltage is reliable, and is therefore usable (along with data obtained by reading the same memory cells using additional threshold voltages) to determine the payload data stored in the memory cells of the word line.

At decision diamond 816, the device compares a first temperature value determined using the data from the temperature indication bits retrieved from the word line with the second temperature value, determined by operation 804, to determine whether an adjusted read property is needed for the additional read operations required to obtain the payload data stored in the memory cells of the word line. As noted above, seven read operations using seven threshold voltages are required to read data stored in X3 memory cells (which store three bits of data per memory cell), and "the additional read operations" are the six read operations corresponding to the threshold voltages between successive voltage ranges A through G (i.e., between voltage ranges A and B, B and C, . . . , and F and G).

In accordance with a determination that an adjusted read property is needed for reading the data stored in the memory cells of the word line, method 800 proceeds to operation 818. In accordance with a determination that an adjusted read property is not needed for reading the data stored in the memory cells of the word line, method 800 proceeds to operation 820.

At operation 818, the device reads the memory cells of the word line (i.e., performs the additional read operations discussed above) using an adjusted read property (e.g., as described with regard to 724-726).

At operation 820, the device reads the memory cells of the word line (i.e., performs the additional read operations discussed above) using a default read property (e.g., as described with regard to 728).

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The semiconductor memory elements located within and/or over a substrate may be arranged in two or three dimensions, such as a two dimensional memory structure or a three dimensional memory structure.

The term "three-dimensional memory device" (or 3D memory device) is herein defined to mean a memory device having multiple memory layers or multiple levels (e.g., sometimes called multiple memory device levels) of memory elements, including any of the following: a memory device having a monolithic or non-monolithic 3D memory array; or two or more 2D and/or 3D memory devices, packaged together to form a stacked-chip memory device.

One of skill in the art will recognize that this invention is not limited to the two dimensional and three dimensional structures described but cover all relevant memory structures within the spirit and scope of the invention as described herein and as understood by one of skill in the art.

It will be understood that, although the terms "first," "second," etc. may be used herein to describe various elements, these elements should not be limited by these terms. These terms are only used to distinguish one element from another. For example, a first storage device could be termed a second storage device, and, similarly, a second storage device could be termed a first storage device, without changing the meaning of the description, so long as all occurrences of the "first storage device" are renamed consistently and all occurrences of the "second storage device" are renamed consistently. The first storage device and the second storage device are both storage devices, but they are not the same storage device.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art.

What is claimed is:

1. A method for adjusting a read property for a memory portion of non-volatile memory in a storage device, the method comprising:
   receiving a program request;
   in response to receiving the program request:
      detecting a first temperature of the memory portion of the non-volatile memory, and
      storing first temperature data corresponding to the detected first temperature, wherein the stored first temperature data includes a series of bits, each stored in an individual non-volatile memory cell, wherein the stored first temperature data indicates a respective temperature range of N predefined temperature ranges, wherein the respective temperature range is indicated by how many bits in the series of bits for the stored first temperature have an erase state, and wherein storing the first temperature data includes:
         appending the first temperature data to a data payload of the program request, and
         storing, to the memory portion of the non-volatile memory,
      the data payload with the appended first temperature data;
   after storing the first temperature data, receiving a read request;
   in response to receiving the read request,
      performing an adjustment determination, wherein the adjustment determination includes:
         detecting a second temperature of the memory portion of the non-volatile memory;
         retrieving the stored first temperature data; and
         determining, in accordance with the detected second temperature and the retrieved first temperature data, whether to perform the read using an adjusted read property, wherein determining whether to perform the read using the adjusted read property includes comparing a second temperature value corresponding to the detected second temperature with a first temperature value corresponding to the retrieved first temperature data;
      in accordance with a determination to perform the read using the adjusted read property, performing a read on the memory portion using the adjusted read property; and
   in accordance with a determination not to perform the read using the adjusted read property, performing a read on the memory portion using a default read property.

2. The method of claim 1, wherein the first temperature data is stored in a data structure that is stored in the storage device.

3. The method of claim 1, wherein:
   the storage device includes a plurality of memory cells;
   the plurality of memory cells each store one of N distinct data values as a cell voltage, wherein the N distinct data values correspond to N sequential voltage ranges; and
   each bit in the series of bits for the stored first temperature is stored in a memory cell having a programmed state indicated by a cell voltage within either a lowest range of the N sequential voltage ranges or a predefined range that is a fourth or higher range of the N sequential voltage ranges, and wherein N is an integer greater than or equal to four.

4. The method of claim 1, wherein the storage device includes a respective non-volatile memory device that includes the memory portion, and the first temperature is detected using a temperature sensor of the respective non-volatile memory device that includes the memory portion.

5. The method of claim 1, wherein the storage device includes a respective non-volatile memory device that includes the memory portion, and the first temperature is detected using a temperature sensor of a controller device that is different from the respective non-volatile memory device that includes the memory portion.

6. The method of claim 1, further comprising: in accordance with the determination to perform the read using the adjusted read property, performing a subsequent write to a respective non-volatile memory device, which is included in the storage device, using an adjusted write property.

7. The method of claim 1, wherein the storage device comprises one or more three-dimensional (3D) memory devices and circuitry associated with operation of memory elements in the one or more 3D memory devices.

8. A method for adjusting a read property for a memory portion of non-volatile memory in a storage device, the method comprising:
receiving a program request;
in response to receiving the program request:
    detecting a first temperature of the memory portion of the non-volatile memory; and
    storing first temperature data corresponding to the detected first temperature;
after storing the first temperature data, receiving a read request;
in response to receiving the read request,
    performing an adjustment determination, wherein the adjustment determination includes:
        detecting a second temperature of the memory portion of the non-volatile memory;
        retrieving the stored first temperature data; and
        determining, in accordance with the detected second temperature and the retrieved first temperature data, whether to perform the read using an adjusted read property, wherein determining whether to perform the read using the adjusted read property includes comparing a second temperature value corresponding to the detected second temperature with a first temperature value corresponding to the retrieved first temperature data;
    in accordance with a determination to perform the read using the adjusted read property, performing a read on the memory portion using the adjusted read property; and
    in accordance with a determination not to perform the read using the adjusted read property, performing a read on the memory portion using a default read property; wherein
    determining whether to perform the read using an adjusted read property includes determining, for a word line corresponding to the memory portion, a ratio of a number of programmed memory cells of the word line to a total number of memory cells of the word line, wherein the total number of memory cells of the word line is equal to the number of programmed memory cells plus a number of erased memory cells of the word line; and
    in accordance with a determination that the determined ratio does not meet predefined ratio criteria, determining to perform the read using the adjusted read property.

9. A storage device, comprising:
non-volatile memory, the non-volatile memory having a plurality of distinct memory portions;
one or more processors;
memory storing one or more programs, which when executed by the one or more processors cause the storage device to:
receive a program request;
in response to receiving the program request:
    detect a first temperature of the memory portion of the non-volatile memory; and
    store first temperature data corresponding to the detected first temperature, wherein the stored first temperature data includes a series of bits, each stored in an individual non-volatile memory cell, wherein the stored first temperature data indicates a respective temperature range of N predefined temperature ranges, wherein the respective temperature range is indicated by how many bits in the series of bits for the stored first temperature have an erase state, and wherein storing the first temperature data includes:
        appending the first temperature data to a data payload of the program request, and
        storing, to the memory portion of the non-volatile memory,
    the data payload with the appended first temperature data;
after storing the first temperature data, receive a read request;
in response to receiving the read request,
    perform an adjustment determination, wherein the adjustment determination includes:
        detecting a second temperature of the memory portion of the non-volatile memory;
        retrieving the stored first temperature data; and
        determining, in accordance with the detected second temperature and the retrieved first temperature data, whether to perform the read using an adjusted read property, wherein determining whether to perform the read using the adjusted read property includes comparing a second temperature value corresponding to the detected second temperature with a first temperature value corresponding to the retrieved first temperature data;
    in accordance with a determination to perform the read using the adjusted read property, perform a read on the memory portion using the adjusted read property; and
    in accordance with a determination not to perform the read using the adjusted read property, perform a read on the memory portion using a default read property.

10. The storage device of claim 9, wherein the first temperature data is stored in a data structure that is stored in the storage device.

11. The storage device of claim 9, wherein:
the storage device includes a plurality of memory cells;
the plurality of memory cells each store one of N distinct data values as a cell voltage, wherein the N distinct data values correspond to N sequential voltage ranges; and
each bit in the series of bits for the stored first temperature is stored in a memory cell having a programmed state indicated by a cell voltage within either a lowest range of the N sequential voltage ranges or a predefined range that is a fourth or higher range of the N sequential voltage ranges, and wherein N is an integer greater than or equal to four.

12. A non-transitory computer readable storage medium, storing one or more programs configured for execution by one or more processors of a storage device, the one or more programs including instructions, which when executed by the one or more processors cause the storage device to:
receive a program request;
in response to receiving the program request:
detect a first temperature of the memory portion of the non-volatile memory; and
store first temperature data corresponding to the detected first temperature, wherein the stored first temperature data includes a series of bits, each stored in an individual non-volatile memory cell, wherein the stored first temperature data indicates a respective temperature range of N predefined temperature ranges, wherein the respective temperature range is indicated by how many bits in the series of bits for the stored first temperature have an erase state, and wherein storing the first temperature data includes:
appending the first temperature data to a data payload of the program request, and
storing, to the memory portion of the non-volatile memory,
the data payload with the appended first temperature data;
after storing the first temperature data, receive a read request;
in response to receiving the read request,
perform an adjustment determination, wherein the adjustment determination includes:
detecting a second temperature of the memory portion of the non-volatile memory;
retrieving the stored first temperature data; and
determining, in accordance with the detected second temperature and the retrieved first temperature data, whether to perform the read using an adjusted read property, wherein determining whether to perform the read using the adjusted read property includes comparing a second temperature value corresponding to the detected second temperature with a first temperature value corresponding to the retrieved first temperature data;
in accordance with a determination to perform the read using the adjusted read property, perform a read on the memory portion using the adjusted read property; and
in accordance with a determination not to perform the read using the adjusted read property, perform a read on the memory portion using a default read property.

13. The non-transitory computer readable storage medium of claim 12, wherein the first temperature data is stored in a data structure that is stored in the storage device.

14. The non-transitory computer readable storage medium of claim 12, wherein:
the storage device includes a plurality of memory cells;
the plurality of memory cells each store one of N distinct data values as a cell voltage, wherein the N distinct data values correspond to N sequential voltage ranges; and
each bit in the series of bits for the stored first temperature is stored in a memory cell having a programmed state indicated by a cell voltage within either a lowest range of the N sequential voltage ranges or a predefined range that is a fourth or higher range of the N sequential voltage ranges, and wherein N is an integer greater than or equal to four.

15. A storage device, comprising:
non-volatile memory, the non-volatile memory having a plurality of distinct memory portions;
one or more processors;
memory storing one or more programs, which when executed by the one or more processors cause the storage device to:
receive a program request;
in response to receiving the program request:
detect a first temperature of the memory portion of the non-volatile memory; and
store first temperature data corresponding to the detected first temperature; and
after storing the first temperature data, receive a read request;
in response to receiving the read request,
perform an adjustment determination, wherein the adjustment determination includes:
detecting a second temperature of the memory portion of the non-volatile memory;
retrieving the stored first temperature data; and
determining, in accordance with the detected second temperature and the retrieved first temperature data, whether to perform the read using an adjusted read property, wherein determining whether to perform the read using the adjusted read property includes comparing a second temperature value corresponding to the detected second temperature with a first temperature value corresponding to the retrieved first temperature data;
in accordance with a determination to perform the read using the adjusted read property, perform a read on the memory portion using the adjusted read property; and
in accordance with a determination not to perform the read using the adjusted read property, perform a read on the memory portion using a default read property;
wherein
determining whether to perform the read using an adjusted read property includes determining, for a word line corresponding to the memory portion, a ratio of a number of programmed memory cells of the word line to a total number of memory cells of the word line, wherein the total number of memory cells of the word line is equal to the number of programmed memory cells plus a number of erased memory cells of the word line; and
in accordance with a determination that the determined ratio does not meet predefined ratio criteria, determining to perform the read using the adjusted read property.

16. A storage device, comprising:
non-volatile memory, the non-volatile memory having a plurality of distinct memory portions;
data write means for storing data in the non-volatile memory, by performing operations including:
receiving a program request;
in response to receiving the program request:
detecting a first temperature of the memory portion of the non-volatile memory; and
storing first temperature data corresponding to the detected first temperature; and
data read means for reading data from in the non-volatile memory, by performing operations including:
after the first temperature data has been stored, receiving a read request;
in response to receiving the read request, performing an adjustment determination, wherein the adjustment determination includes:
  detecting a second temperature of the memory portion of the non-volatile memory;
  retrieving the stored first temperature data; and
  determining, in accordance with the detected second temperature and the retrieved first temperature data, whether to perform the read using an adjusted read property, wherein determining whether to perform the read using the adjusted read property includes comparing a second temperature value corresponding to the detected second temperature with a first temperature value corresponding to the retrieved first temperature data;
in accordance with a determination to perform the read using the adjusted read property, performing a read on the memory portion using the adjusted read property; and in accordance with a determination not to perform the read using the adjusted read property, performing a read on the memory portion using a default read property;
wherein
  determining whether to perform the read using an adjusted read property includes determining, for a word line corresponding to the memory portion, a ratio of a number of programmed memory cells of the word line to a total number of memory cells of the word line, wherein the total number of memory cells of the word line is equal to the number of programmed memory cells plus a number of erased memory cells of the word line; and
in accordance with a determination that the determined ratio does not meet predefined ratio criteria, determining to perform the read using the adjusted read property.

* * * * *